(12) United States Patent
Kanno et al.

(10) Patent No.: US 10,033,357 B2
(45) Date of Patent: Jul. 24, 2018

(54) SEMICONDUCTOR DEVICE

(71) Applicant: Hitachi, Ltd., Chiyoda-ku, Tokyo (JP)

(72) Inventors: Yusuke Kanno, Tokyo (JP); Takeshi Sakata, Tokyo (JP); Nobuyasu Kanekawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 179 days.

(21) Appl. No.: 15/028,568

(22) PCT Filed: Oct. 16, 2013

(86) PCT No.: PCT/JP2013/078088
§ 371 (c)(1),
(2) Date: Apr. 11, 2016

(87) PCT Pub. No.: WO2015/056314
PCT Pub. Date: Apr. 23, 2015

(65) Prior Publication Data
US 2016/0254803 A1 Sep. 1, 2016

(51) Int. Cl.
*H03K 3/037* (2006.01)
*H03K 19/23* (2006.01)
(Continued)

(52) U.S. Cl.
CPC ......... *H03K 3/0375* (2013.01); *H03K 3/0372* (2013.01); *H03K 3/35625* (2013.01);
(Continued)

(58) Field of Classification Search
CPC ............. H03K 3/012; H03K 3/356104; H03K 3/35625; H03K 3/0372; H03K 5/00006
(Continued)

(56) References Cited

U.S. PATENT DOCUMENTS 6,563,356 B2 * 5/2003 Fulkerson .............. H03K 3/012
327/203
6,646,464 B2 11/2003 Maruyama
(Continued)

FOREIGN PATENT DOCUMENTS

JP 2002-185309 A 6/2002
JP 2009-538549 A 11/2009
(Continued)

OTHER PUBLICATIONS

International Search Report (PCT/ISA/210) issued in PCT Application No. PCT/JP2013/078088 dated Nov. 26, 2013 with English-language translation (two (2) pages).
Japanese-language Office Action issued in counterpart Japanese Application No. 2015-542441 dated Jul. 4, 2017 (Eight (8) pages).

*Primary Examiner* — Dinh T Le
(74) *Attorney, Agent, or Firm* — Crowell & Moring LLP

(57) ABSTRACT

Provided is a semiconductor device capable of reducing a penalty associated with ensuring reliability. The semiconductor device includes a latch circuit which has input/output paths of three systems or more independent from each other. The latch circuit includes a plurality of storage elements STE1 to STE3 which are provided on the input/output paths of the three systems or more, respectively, and hold input data in synchronization with a clock signal. At least one storage element (for example, STE1) of the plurality of storage elements STE1 to STE3 includes a majority decision unit (for example, 81a) executing a majority decision using data from the storage elements provided on other input/output paths different from the input/output path thereof and outputs data in which a result of the majority decision is reflected.

14 Claims, 21 Drawing Sheets

(51) Int. Cl.
    *H03K 3/3562*     (2006.01)
    *H03K 19/0948*    (2006.01)
    *H03K 19/177*     (2006.01)
    *H03K 19/20*      (2006.01)

(52) U.S. Cl.
    CPC ... *H03K 19/0948* (2013.01); *H03K 19/17724* (2013.01); *H03K 19/17728* (2013.01); *H03K 19/20* (2013.01); *H03K 19/23* (2013.01)

(58) Field of Classification Search
    USPC .................................. 327/57, 52, 200–229
    See application file for complete search history.

(56) References Cited

U.S. PATENT DOCUMENTS

| | | | |
|---|---|---|---|
| 6,831,496 | B2 | 12/2004 | Gardner |
| 8,581,652 | B2 | 11/2013 | Kobayashi et al. |
| 9,473,117 | B2 * | 10/2016 | Kim .................. G01R 31/3177 |
| 9,625,938 | B2 * | 4/2017 | Thazhatheppattu ...... G06F 1/10 |
| 2002/0074609 | A1 | 6/2002 | Maruyama |

FOREIGN PATENT DOCUMENTS

| | | |
|---|---|---|
| JP | 2010-273322 A | 12/2010 |
| JP | 2012-151790 A | 8/2012 |
| WO | WO 2007/127917 A2 | 11/2007 |
| WO | WO 2011/155532 A1 | 12/2011 |

\* cited by examiner

FIG. 2A
FIG. 2B
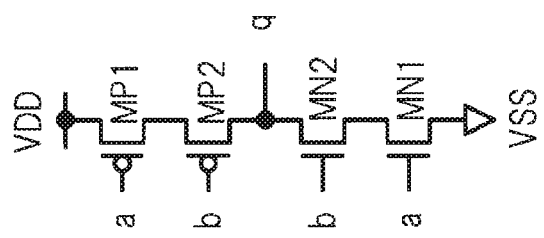
FIG. 2C
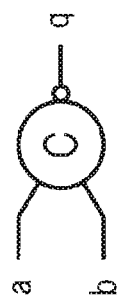

FIG. 5A
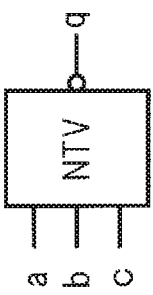
FIG. 5B
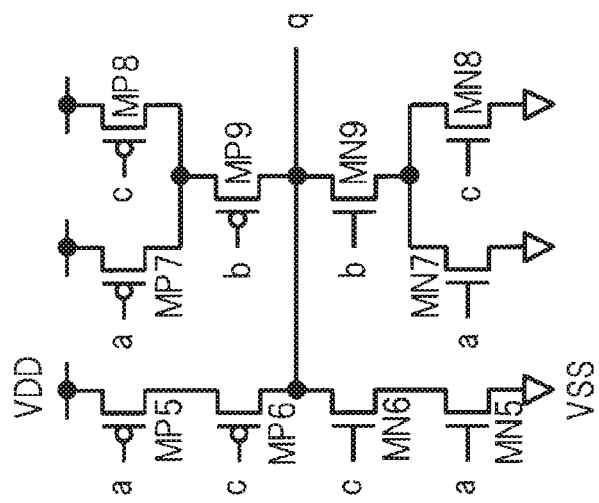
FIG. 5C
| a | b | c | q |
|---|---|---|---|
| L | L | L | H |
| L | L | H | H |
| L | H | L | H |
| L | H | H | L |
| H | L | L | H |
| H | L | H | L |
| H | H | L | L |
| H | H | H | L |

FIG. 7C
| gb | gt | a | b | q |
|----|----|----|----|----|
| H | L | L | L | N |
| H | L | L | H | N |
| H | L | H | L | N |
| H | L | H | H | N |
| L | H | L | L | H |
| L | H | L | H | M |
| L | H | H | L | N |
| L | H | H | H | L |
FIG. 7B
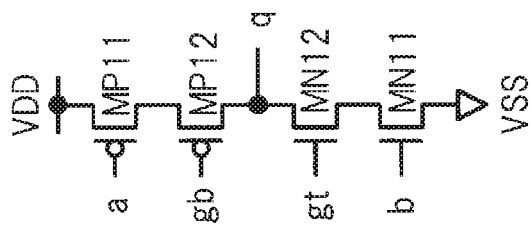
FIG. 7A
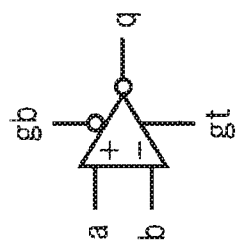

81a TO 81c: MAJORITY DECISION UNIT
STE1 TO STE3: STORAGE ELEMENT

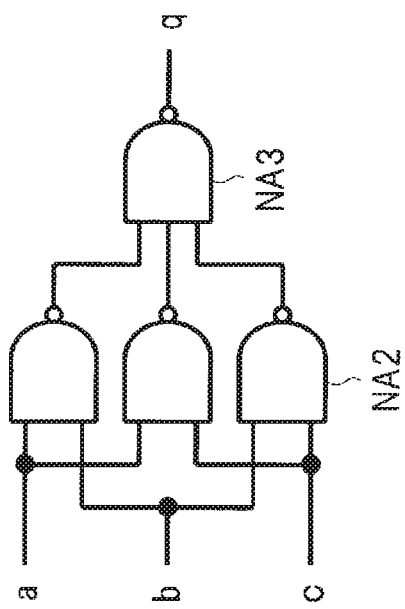

SEMICONDUCTOR DEVICE

TECHNICAL FIELD

The present invention relates to a semiconductor device. For example, the present invention relates to a semiconductor device that includes a latch circuit in which high reliability is required.

BACKGROUND ART

For example, a data holding circuit that has three flip-flops and a majority logic circuit outputting a signal according to a logic value having a majority among outputs thereof is disclosed in PTL 1. A configuration in which a C element circuit is provided between two master latch circuits and two slave latch circuits is disclosed in PTL 2. The C element circuit includes logic to hold an immediately previous value, even when holding data of one of the two master latch circuits is inverted due to an error. A cause of an error in an electronic apparatus and countermeasures thereof are described in NPL 1.

CITATION LIST

Patent Literature

PTL 1: JP-A-2002-185309
PTL 2: WO2011/155532

Non Patent Literature

NPL 1: N. Kanekawa, E. H. Ibe, and T. Suga, "Dependability in Electronic Systems: Mitigation of Hardware Failures, Soft Errors, and Electro-Magnetic Disturbances,", Springer, 2010

SUMMARY OF INVENTION

Technical Problem

Recently, with advancement of automation of control, demands of safety and reliability for an electronic control system increase. Therefore, there is a demand for high reliability in a semiconductor device used for the system. As technology for increasing the reliability of the semiconductor device, technology disclosed in Citation List is known.

FIG. 21 is a circuit block diagram illustrating a schematic configuration example of a semiconductor device examined as the premise of the present invention. It is thought that a triplication logic circuit with fine granularity illustrated in FIG. 21 is used as technology for increasing the reliability of the semiconductor device. In FIG. 21, each of CL11, CL12, and CL13 and CL21, CL22, and CL23 shows triplicated combination logic circuits. A flip-flop FF is also triplicated and a majority decision circuit TRV is provided for each flip-flip FF. In this drawing, the case in which a logic circuit of a pipeline configuration is triplicated is illustrated. However, a sequential circuit can also be configured in the same way by providing a feedback loop.

FIG. 22(a) is a circuit diagram illustrating a configuration example of the majority decision circuit in FIG. 21 and FIG. 22(b) is a truth table illustrating an operation example of FIG. 22(a). As illustrated in FIG. 22(a), the majority decision circuit TRV includes three two-input NAND gates NA2 and a three-input NAND gate NA3. As illustrated in FIG. 22(b), in the majority decision circuit TRV, if at least two of three inputs a, b, and c are at a low level ('L'), a level of an output q becomes a low level ('L') and if at least two are at a high level ('H'), the level of the output q becomes a high level ('H').

In the triplication logic circuit with the fine granularity, even though an error occurs with the combination logic circuit or the flip-flop, the error is recovered by executing a majority decision by the majority decision circuit TRV. The majority decision circuit TRV is also triplicated, so that an error of the majority decision circuit TRV can be recovered by a majority decision circuit TRV of a next step. As such, because one error can be recovered between the majority decision circuits TRV, high reliability is obtained by providing the majority decision circuit TRV for each flip-flop FF.

However, the triplication logic circuit with the fine granularity has a circuit scale to be three times larger than a circuit scale of an original logic circuit to triplicate the combination logic circuit and the flip-flop and the majority decision circuit is provided for each flip-flop. For this reason, a penalty increases. The majority decision circuit TRV illustrated in FIG. 22(a) has the same circuit scale as a D flip-flop and an area/consumption power/delay time thereof increases.

The invention has been made in view of the above circumstances and an object of the invention is to provide a semiconductor device that can reduce a penalty associated with ensuring reliability.

Other objects and new features of the invention will become apparent from the following description of embodiments with reference to the accompanying drawings.

Solution to Problem

An outline of a representative embodiment of the invention disclosed in the present application is as follows.

A semiconductor device according to this embodiment has a latch circuit which has input/output paths of three systems or more independent from each other. The latch circuit includes a plurality of storage elements which are provided on the input/output paths of the three systems or more, respectively, and hold input data in synchronization with a clock signal. Here, at least one storage element of the plurality of storage elements includes a majority decision unit executing a majority decision using data from the storage elements provided on other input/output paths different from the input/output path thereof and outputs data in which a result of the majority decision is reflected.

Advantageous Effects of Invention

According to effects obtained by a representative embodiment of the invention disclosed in the present application, a penalty associated with ensuring reliability can be reduced in a semiconductor device.

BRIEF DESCRIPTION OF DRAWINGS

FIG. 2A is a diagram defining a symbol of a C element in FIG. 1.

FIG. 2B is a circuit diagram illustrating a detailed configuration example of FIG. 2A.

FIG. 2C is a truth table illustrating an operation example of FIG. 2B.

FIG. 5A is a diagram defining a symbol of a composite gate for majority decision in FIG. 4.

FIG. 5B is a circuit diagram illustrating a detailed configuration example of FIG. 5A.

FIG. 5C is a truth table illustrating an operation example of FIG. 5B.

FIG. 7A is a diagram defining a symbol of a gate for majority decision in FIG. 6.

FIG. 7B is a circuit diagram illustrating a detailed configuration example of FIG. 7A.

FIG. 7C is a truth table illustrating an operation example of FIG. 7B.

FIG. 22A is a circuit diagram illustrating a configuration example of a majority decision circuit in FIG. 21.

FIG. 22B is a truth table illustrating an operation example of FIG. 22A.

DESCRIPTION OF EMBODIMENTS

Figure 1:
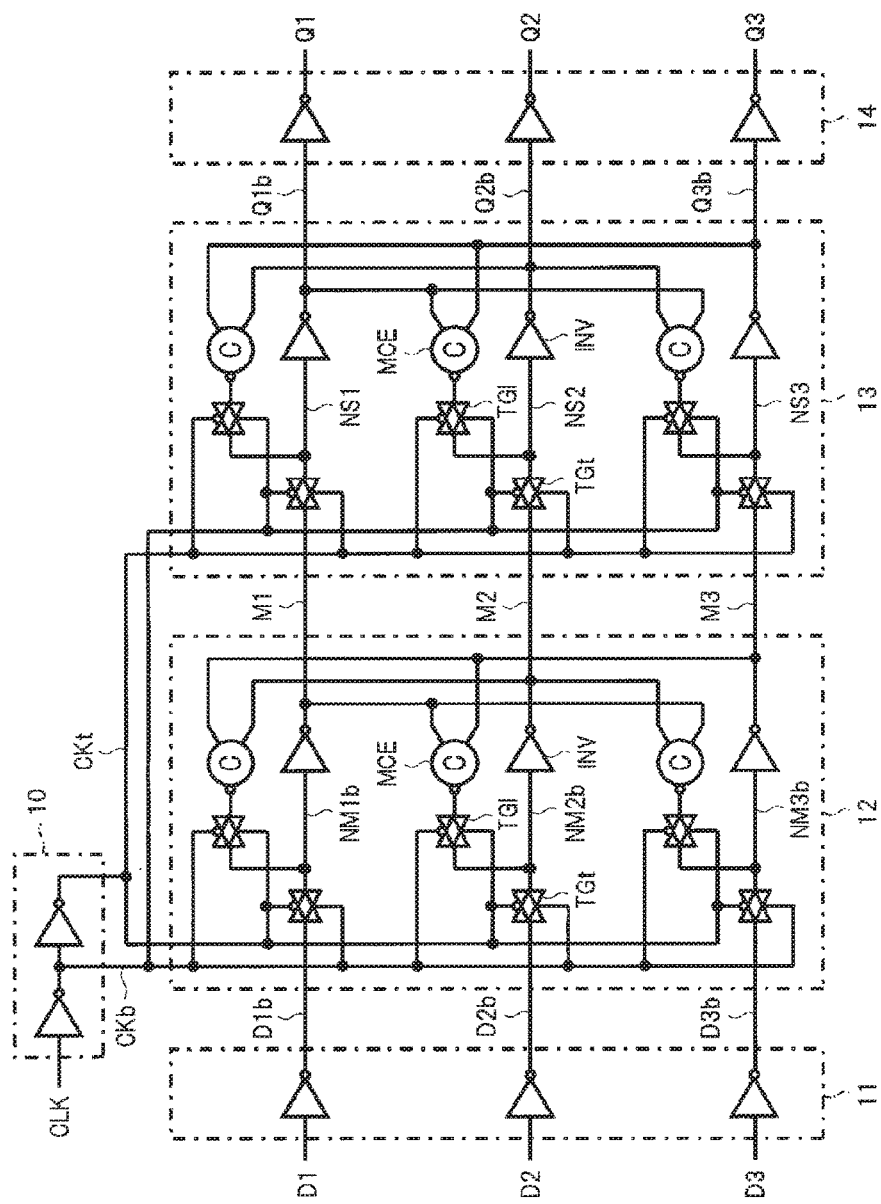
FIG. 1 is a circuit diagram illustrating a configuration example of a flip-flop included in a semiconductor device according to a first embodiment of the present invention.

In embodiments described below, the present invention will be described in a plurality of sections or embodiments when required as a matter of convenience. However, these sections or embodiments are not irrelevant to each other unless otherwise stated and one relates to the entire or part of the other as a modification, details, or a supplementary explanation thereof. In addition, in the embodiments described below, when referring to the number of elements (including the number of pieces, numerical values, amounts, ranges, and the like), the number of the elements is not limited to a specific number unless otherwise stated and except for the case in which the number is apparently limited to a specific number in principle and the number larger or smaller than the specified number is also applicable.

In addition, in the embodiments described below, it goes without saying that components (including element steps and the like) are not always indispensable unless otherwise stated and except for the case in which the components are apparently indispensable in principle. Similarly, in the embodiments described below, when shapes of the components, a positional relation thereof, and the like are mentioned, the substantially approximate and similar shapes and the like are included therein unless otherwise stated and except for the case in which it is conceivable that they are apparently excluded in principle. The same is applicable to the numerical values and the ranges described above.

In addition, a circuit element configuring each functional block according to an embodiment is not limited in particular. However, the circuit element is formed on a semiconductor substrate such as single crystal silicon by integrated circuit technology such as a known complementary metal oxide semiconductor transistor (CMOS). In the embodiment, a metal oxide semiconductor field effect transistor (abbreviated as a MOS transistor: MOSFET) is used as an example of a metal insulator semiconductor field effect transistor (MISFET). However, a non-oxide film is not excluded as a gate insulating film.

Hereinafter, embodiments of the present invention will be described in detail on the basis of the drawings. In all drawings to describe the embodiments, the same members are denoted with the same reference numerals in principle and repetitive description thereof is omitted.

(First Embodiment)

<<Configuration of Main Portion of Semiconductor Device>>

FIG. 1 is a circuit diagram illustrating a configuration example of a flip-flop included in a semiconductor device according to a first embodiment of the present invention. As illustrated in FIG. 1, one of main characteristics of the semiconductor device according to the first embodiment is that C elements MCE to execute a majority decision are provided in latch units (12 and 13) configuring the flip-flop. In this example, the C element MCE is provided on a feedback path in the latch unit.

The flip-flop illustrated in FIG. 1 includes a clock buffer unit 10, an input buffer unit 11, a master latch unit 12, a slave latch unit 13, and an output buffer unit 14. The clock buffer unit 10 includes two inverters and receives a clock signal CLK and supplies complementary internal clock signals CKb and CKt to the master latch unit 12 and the slave latch unit 13. The input buffer unit 11 includes three inverters. In the input buffer unit 11, in a normal mode, the same logic levels are input to flip-flop input nodes D1, D2, and D3 and the individual logic levels are inverted and are output to nodes D1b, D2b, and D3b.

The master latch unit 12 includes three transfer gates TGt for transmission, three transfer gates TG1 for latch, three inverters INV, and three C elements MCE. The master latch unit 12 is controlled by the internal clock signals CKb and CKt, receives predetermined logic levels from the nodes D1b, D2b, and D3b, and outputs predetermined logic levels to intermediate nodes M1, M2, and M3. In the master latch unit 12, circuits of three systems using the nodes D1b, D2b, and D3b as inputs have the same configuration.

For example, in the case of a system using the node D2b as an input, first, when the clock signal CLK is at a low level, the transfer gate TGt for transmission transmits a logic level of the node D2b to a node NM2b. The inverter INV buffers and inverts a logic level of the node NM2b and outputs the logic level to the intermediate node M2. The C element MCE receives logic levels of the intermediate nodes M1 and M3 in the other two systems (D1b and D3b) and outputs a logic level to the transfer gate TG1 for latch. When the clock signal CLK is at a high level, the transfer gate TG1 for latch feeds back an output of the C element MCE to the node NM2b.

In the first embodiment, transmission from the master latch unit 12 to the slave latch unit 13 is transmission via the intermediate nodes M1, M2, and M3. However, the transmission may be transmission using the nodes NM1b, NM2b, and NM3b. In this case, it should be noted that signs of the logic are different. However, there is an effect of speeding up by reduction of the number of steps. This is applicable to each embodiment to be described below.

Similarly, the slave latch unit 13 includes three transfer gates TGt for transmission, three transfer gates TG1 for latch, three inverters INV, and three C elements MCE. The slave latch unit 13 is controlled by the internal clock signals CKb and CKt, receives predetermined logic levels from the intermediate nodes M1, M2, and M3, and outputs the predetermined logic levels to nodes Q1b, Q2b, and Q3b.

In the first embodiment, transmission from the slave latch unit 13 to the output buffer unit 14 is transmission via the nodes Q1b, Q2b, and Q3b. However, the transmission may be transmission using nodes NS1, NS2, and NS3. In this case, it should be noted that signs of the logic are different. However, there is an effect of speeding up by reduction of the number of steps and there is an effect of a small area when inversion outputs are output at the same time. This is applicable to each embodiment to be described below.

A detailed configuration of the slave latch unit 13 is the same as the configuration of the master latch unit 12, except that polarities of the clock signal CLK for the transfer gate TGt for transmission and the transfer gate TG1 for latch become opposite to each other. For example, in the case of a system using the intermediate node M2 as an input, the C element MCE in the slave latch unit 13 receives logic levels of the nodes Q1b and Q3b in the other two systems (M1 and M3) and outputs a logic level to the transfer gate TG1 for latch. The output buffer unit 14 includes three inverters and inverts the logic levels input from the nodes Q1b, Q2b, and Q3b and outputs the logic levels to flip-flop output nodes Q1, Q2, and Q3.

FIG. 2(a) is a diagram defining a symbol of the C element in FIG. 1, FIG. 2(b) is a circuit diagram illustrating a detailed configuration example of FIG. 2(a), and FIG. 2(c) is a truth table illustrating an operation example of FIG. 2(b). As illustrated in FIG. 2(a), the C element MCE has two inputs a and b and one output q. As illustrated in FIG. 2(b), the C element MCE includes two PMOS transistors (first conductive transistors) MP1 and MP2 and two NMOS transistors (second conductive transistors) MN1 and MN2.

The two PMOS transistors MP1 and MP2 are connected in series between a power supply voltage (high potential side power supply voltage) VDD and the output q and the two NMOS transistors MN1 and MN2 are connected in series between a ground power supply voltage (low potential side power supply voltage) VSS and the output q. ON and OFF of the two PMOS transistors MP1 and MP2 are controlled by the two inputs a and b, respectively, and ON and OFF of the two NMOS transistors MN1 and MN2 are controlled by the two inputs a and b, respectively.

In the truth table of FIG. 2(c), 'L' shows a low level, 'H' shows a high level, and 'Z' shows high impedance. As illustrated in FIG. 2(c), if logic levels of the two inputs a and b are matched with each other, the C element MCE of FIGS. 2(a) and 2(b) inverts and amplifies the logic level and outputs the logic level to the output q. Meanwhile, if the logic levels of the two inputs a and b are mismatched with each other, the C element MCE outputs the high impedance to the output q.

<<Operation of Main Portion of Semiconductor Device>>

Figure 3:
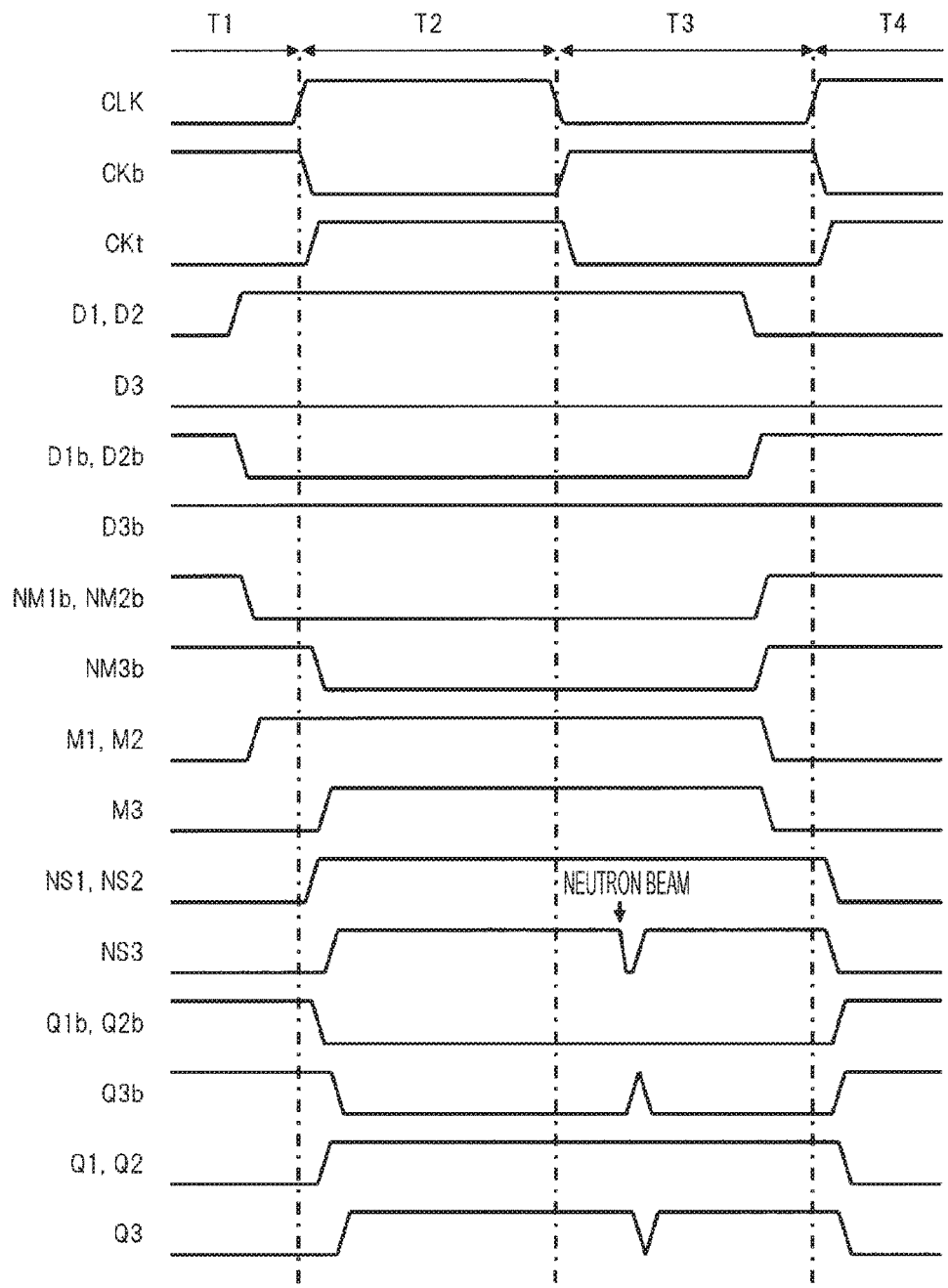
FIG. 3 is a waveform diagram illustrating an operation example of the flip-flop of FIG. 1.

FIG. 3 is a waveform diagram illustrating an operation example of the flip-flop of FIG. 1. In FIG. 3, first, when the clock signal CLK is at a low level (period T1), the master latch unit 12 is in a transparent state and the slave latch unit 13 is in a latch state. Here, an example of the case in which each level of D1 and D2 in the three flip-flop input nodes D1, D2, and D3 changes from a low level to a high level and D3 maintains a low level is described.

In this case, each level of the nodes D1b and D2b becomes a low level. In the master latch unit 12, the transfer gate TGt for transmission is turned on according to a low level of the clock signal CLK. For this reason, the low levels of the nodes D1b and D2b are transmitted to the nodes NM1b and NM2b becoming inputs of the two inverters INV via the transfer gates TGt for transmission. According to this, the two inverters INV output high levels to the intermediate nodes M1 and M2. Meanwhile, the node D3b and the node NM3b becoming an input of the remaining inverter INV maintain a high level and the intermediate node M3 maintains a low level.

Next, if a level of the clock signal CLK rises to a high level (period T2), the transfer gate TG1 for latch in the master latch unit 12 is turned on and a state of the master latch unit 12 changes to a latch state. Because only M3 in the intermediate nodes M1, M2, and M3 is at a low level, two of the three C elements MCE in the master latch unit 12 output the high impedance. The nodes NM1b and NM2b are floated by the output of the high impedance of the two C elements MCE. However, the nodes maintain almost a low level by capacity components of the nodes.

Meanwhile, because the intermediate nodes M1 and M2 are at a high level, the node NM3b is driven at a low level through the transfer gate TG1 for latch by the C element MCE. Thereby, a level of the intermediate node M3 becomes a high level. As a result, levels of the three intermediate nodes M1, M2, and M3 are matched at a high level, the two C elements MCE outputting the high impedance output a low level, and the nodes NM1b and NM2b are also stabilized at a low level.

As such, the master latch unit 12 is operated to arrange values of the intermediate nodes M1, M2, and M3, using the C element MCE. At this time, in the case in which logic levels of the other two systems other than the self system are matched with each other, because the logic levels become a logic level obtained by the majority, the C element MCE reflects the logic levels and drives an input node of the inverter INV of the self system. Meanwhile, in the case in which the logic levels of the other two systems other than the self system are mismatched with each other, because the logic level of the self system becomes the logic level obtained by the majority, the C element MCE outputs the high impedance.

If the level of the clock signal CLK rises to a high level (period T2), the transfer gate TGt for transmission in the slave latch unit 13 is turned on and the slave latch unit 13 enters a transparent state. Because the intermediate nodes M1 and M2 are at a high level immediately after the level of the clock signal CLK rises, levels of the nodes NS1 and NS2 becoming inputs of the two inverters INV become a high level and levels of the nodes Q1b and Q2b becoming outputs of the two inverters INV become a low level. As a result, levels of the flip-flop output nodes Q1 and Q2 become a high level.

Meanwhile, the intermediate node M3 is at a low level immediately after the level of the clock signal CLK rises. However, as described above, if a level of the intermediate node M3 becomes a high level by a feedback operation in the master latch unit 12, a level of the node NS3 becomes a high level and a level of the flip-flop output node Q3 becomes a high level. As a result, as an operation of the flip-flop, when the level of the clock signal CLK rises, a logic level obtained by executing the majority decision with respect to the three flip-flop input nodes D1, D2, and D3 becomes the logic level obtained by the three flip-flop output nodes Q1, Q2, and Q3.

Next, if the level of the clock signal CLK falls to a low level (period T3), the master latch unit 12 enters a transparent state and the slave latch unit 13 enters a latch state. Because the logic levels of the flip-flop input nodes D1, D2, and D3 do not change, the logic levels of the individual nodes of the master latch unit 12 and the slave latch unit 13 and the flip-flop output nodes Q1, Q2, and Q3 are also maintained in the same state.

Here, the case in which a level of the node NS3 of the slave latch unit 13 in a latch state is changed to a low level by a neutron beam in the period T3 is assumed. In this case, generally, a level of the node Q3b becomes a high level and a level of the flip-flop output node Q3 becomes a low level. Because the nodes Q1b and Q2b maintain a low level, the node NS3 is driven by the C element MCE in the slave latch unit 13 and a level thereof returns to a high level, a level of the node Q3b becomes a low level, and a level of the flip-flop output node Q3 returns to a high level. That is, a soft error due to the neutron beam is recovered. Because an output of the C element MCE temporarily becomes the high impedance, the nodes NS1 and NS2 are temporarily floated. However, the level of the node Q3b returns to a low level, so that the nodes NS1 and NS2 are driven at a high level.

In the period T3, if the levels of the flip-flop input nodes D1 and D2 become the same low level as the flip-flop input node D3 from a high level, levels of the nodes D1b and D2b and the nodes NM1b and NM2b become a high level and levels of the intermediate nodes M1 and M2 become a low level. In this state, if the level of the clock signal CLK rises to a high level (period T4), the master latch unit 12 enters a latch state. Because the three inputs are at the same logic levels, the master latch unit 12 maintains an internal state equally. The slave latch unit 13 enters a transparent state and levels of the flip-flop output nodes Q1, Q2, and Q3 become a low level.

<<Main Effects According to this Embodiment>>

As described above, the flip-flop according to the first embodiment is used, so that the error in which the logic levels of the three flip-flop input nodes are mismatched with each other can be corrected, and an influence of the soft error of the flip-flop can be reduced. Specifically, even though the master latch unit 12 and the slave latch unit 13 are in a latch state and the logic level of one node is inverted due to the soft error by the neutron beam, an original state can be recovered. That is, single event upset (SEU) does not occur and single event transition (SET) occurs, so that the influence of the soft error can be reduced.

Here, the error of one node is mainly assumed. However, if an inversion interval of a plurality of nodes is not very short (for example, if a period in which both two inputs to the C element become errors is not generated) even when the inversion of the plurality of nodes occurs, the errors can be recovered. As described above, in the method according to the first embodiment, an output of the C element may become the high impedance. As a result, a period in which the node holds a logic level by the parasitic capacity is generated. This period becomes a period until an output of the C element changes according to rising of the level of the intermediate node M3 from a start point of time of the period T2, in FIG. 3. As such, because the period ends by ending the majority decision and becomes a very short period, a problem does not occur in particular.

Here, the C element is provided on the feedback path (for example, a signal path using the node NM2b as an output), not the transmission path (for example, a signal path using the node NM2b as an input), in the master latch unit 12 and the slave latch unit 13. When the majority decision is executed on the transmission path, a delay thereof may affect an operation speed of the flip-flop. However, here, because the majority decision is executed on the feedback path, an influence on the operation speed of the flip-flop can be reduced.

When the latch state is maintained for a long time in the master latch unit 12 or the slave latch unit 13, the majority decision ends at the time of entering the latch state and an arranged state is held. As a result, a state in which the output of the C element becomes the high impedance is not maintained long. For this reason, so-called clock gating in which the level of the clock signal is fixed to a high level or a low level to suppress consumption power in the flip-flop can be applied.

As the schematic configuration of the flip-flop of FIG. 1, the three master/slave-type D flip-flops are basically used, the clock buffer unit is shared, the inverters for the feedback in the master latch unit and the slave latch unit are replaced with the C elements, and the feedback is performed from the other two D flip-flops. In the C element, as illustrated in FIG. 2 (b), each of the PMOS transistor and the NMOS transistor is provided two by two and a majority decision function is realized with a slight increase of the number of transistors with respect to the three D flip-flops. For this reason, as compared with a configuration illustrated in FIG. 21, a penalty such as an area/consumption power/delay time associated with ensuring reliability using the majority decision can be greatly reduced.

Figure 21:
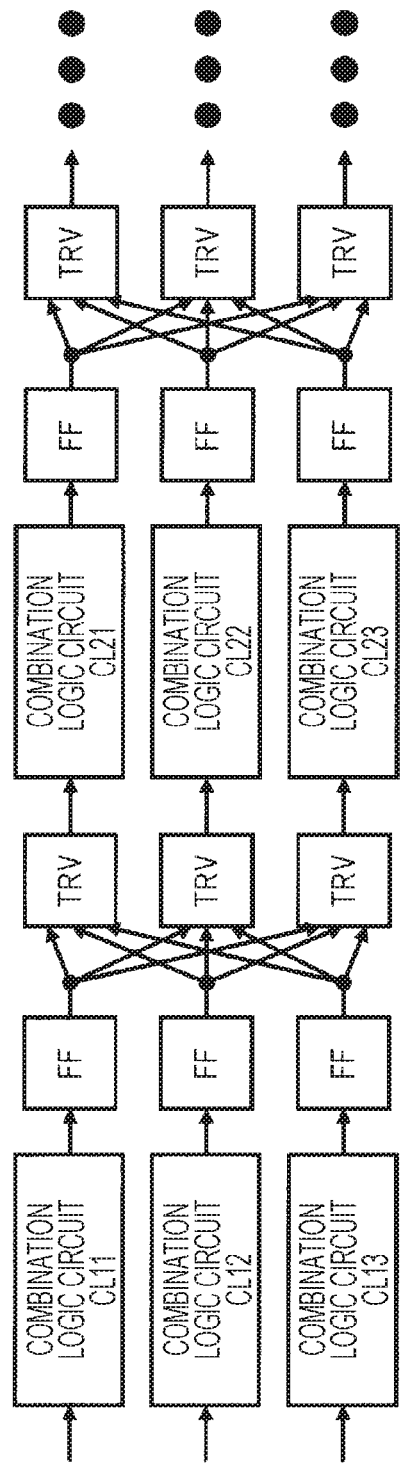
FIG. 21 is a circuit block diagram illustrating a schematic configuration example of a semiconductor device examined as the premise of the present invention.

In the flip-flop according to the first embodiment, the C element (that is, the majority decision unit) is provided in the latch circuit including the transmission path and the feedback path and holding data of the latch circuit is automatically modified. For this reason, a recovery process when an error occurs with a state machine can be facilitated. Specifically, in the state machine, output data is determined on the basis of input data and a current state held in the flip-flop. In FIG. 21, the case in which a state machine feeding back an output of a flip-flop FF to an input side appropriately and holding a state in the flip-flop FF is configured is assumed.

When an error occurs in a flip-flop holding a state in any one of the three systems, the error of the state is kept. For this reason, in the error system, erroneous output data may be generated at all times according to the input data thereafter. At this time, the output of the whole system can be modified by the majority decision of the three systems. Then, if an error occurs in a different system, the output of the whole system also becomes an error. For this reason, when the error occurs in the flip-flop, the recovery process is preferably executed early. Specifically, a complex process in which a state is read from a flip-flop of a normal system and the state is written to the flip-flop of the error system is necessary. Meanwhile, in the method according to the first embodiment, because the holding data (that is, the state) of the flip-flop can be automatically modified, the recovery process is not necessary.

(Second Embodiment)

<<Configuration of Main Portion of Semiconductor Device (Modification [1])>>

Figure 4:
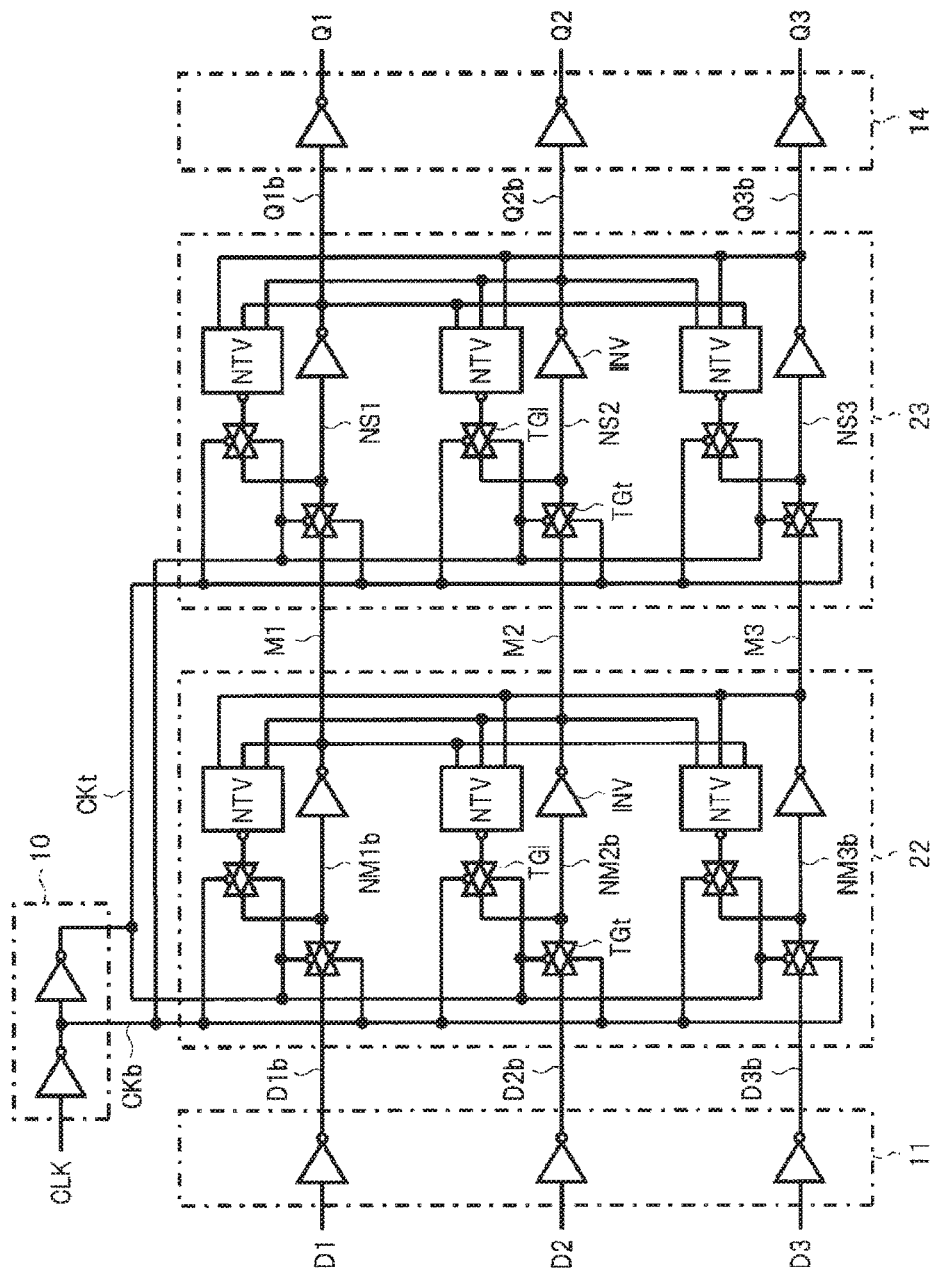
FIG. 4 is a circuit diagram illustrating a configuration example of a flip-flop included in a semiconductor device according to a second embodiment of the present invention.

FIG. 4 is a circuit diagram illustrating a configuration example of a flip-flop included in a semiconductor device according to a second embodiment of the present invention. As illustrated in FIG. 4, the semiconductor device according to the second embodiment is characterized by that the C element MCE in FIG. 1 is replaced with a composite gate NTV for majority decision executing the majority decision with an inversion type.

The flip-flop illustrated in FIG. 4 includes a clock buffer unit 10, an input buffer unit 11, a master latch unit 22, a slave latch unit 23, and an output buffer unit 14. Because the clock buffer unit 10, the input buffer unit 11, and the output buffer unit 14 have the same configurations as the configurations in FIG. 1, detailed description thereof is omitted. Similar to the case of FIG. 1, each of the master latch unit 22 and the slave latch unit 23 includes three transfer gates TGt for transmission, three transfer gates TG1 for latch, and three inverters INV. Different from the case of FIG. 1, each of the master latch unit 22 and the slave latch unit 23 includes three composite gates NTV for majority decision.

FIG. 5(a) is a diagram defining a symbol of the composite gate for majority decision in FIG. 4, FIG. 5(b) is a circuit diagram illustrating a detailed configuration example of FIG. 5(a), and FIG. 5(c) is a truth table illustrating an operation example of FIG. 5(b). As illustrated in FIG. 5(a), the composite gate NTV for majority decision has three inputs a, b, and c and one output q. As illustrated in FIG. 5(b), the composite gate NTV for majority decision includes five PMOS transistors MP5 to MP9 and five NMOS transistors MN5 to MN9.

The PMOS transistors MP5 and MP6 are connected in series between a power supply voltage VDD and the output q. The PMOS transistors MP7 and MP9 are connected in series between the power supply voltage VDD and the output q and the PMOS transistor MP8 is connected in parallel to the PMOS transistor MP7. Likewise, the NMOS transistors MN5 and MN6 are connected in series between a ground power supply voltage VSS and the output q. The NMOS transistors MN7 and MN9 are connected in series between the ground power supply voltage VSS and the output q and the NMOS transistor MN8 is connected in parallel to the NMOS transistor MN7.

ON and OFF of the PMOS transistors MP5 and MP7 and the NMOS transistors MN5 and MN7 are controlled by the input a. ON and OFF of the PMOS transistor MP9 and the NMOS transistor MN9 are controlled by the input b. ON and OFF of the PMOS transistors MP6 and MP8 and the NMOS transistors MN6 and MN8 are controlled by the input c.

As illustrated in FIG. 5(c), the composite gate NTV for majority decision in FIGS. 5(a) and 5(b) inverts logic levels matched in at least two inputs of the three inputs a, b, and c and generates the output q. That is, the composite gate NTV for majority decision executes the majority decision. In FIG. 4, the composite gate NTV for majority decision in the master latch unit 22 outputs majority decision results of intermediate nodes M1, M2, and M3 and the composite gate NTV for majority decision in the slave latch unit 23 outputs majority decision results of nodes Q1b, Q2b, and Q3b.

Even when the flip-flop according to the second embodiment is used, the same effects as the various effects described in the first embodiment are obtained. In the configuration example of FIG. 4, the effects of the configuration example of FIG. 1 are not obtained from the viewpoint of a circuit area or consumption power. However, as compared with the configuration of FIG. 21, an effect of reducing inverters for feedback according to replacement with the composite gate NTV for majority decision is obtained. In addition, in the configuration example of FIG. 4, different from the configuration example of FIG. 1, high impedance is not output as a majority decision result. Therefore, nodes NM1b, NM2b, and NM3b are not floated and noise resistance can be increased as compared with the configuration example of FIG. 1.

(Third Embodiment)

<<Configuration of Main Portion of Semiconductor Device (Modification [2])>>

Figure 6:
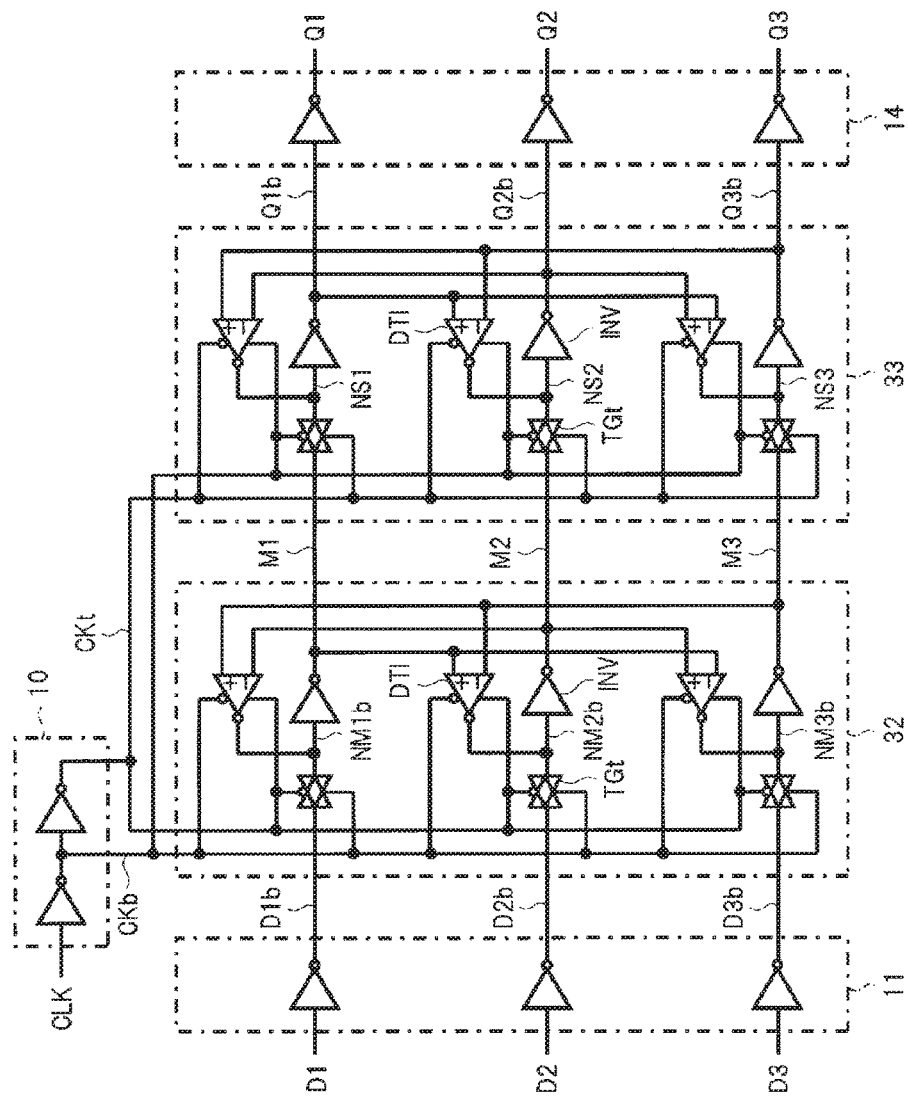
FIG. 6 is a circuit diagram illustrating a configuration example of a flip-flop included in a semiconductor device according to a third embodiment of the present invention.

FIG. 6 is a circuit diagram illustrating a configuration example of a flip-flop included in a semiconductor device according to a third embodiment of the present invention. As illustrated in FIG. 6, the semiconductor device according to the third embodiment is characterized by that the C element MCE and the transfer gate TG1 for latch in FIG. 1 are replaced with a gate DTI for majority decision with a configuration in which inputs of a three-state inverter are separated.

The flip-flop illustrated in FIG. 6 includes a clock buffer unit 10, an input buffer unit 11, a master latch unit 32, a slave latch unit 33, and an output buffer unit 14. Because the clock buffer unit 10, the input buffer unit 11, and the output buffer unit 14 have the same configurations as the configurations in FIG. 1, detailed description thereof is omitted. Similar to the case of FIG. 1, each of the master latch unit 22 and the slave latch unit 23 includes three transfer gates TGt for transmission, three transfer gates TG1 for latch, and three inverters INV. Different from the case of FIG. 1, each of the master latch unit 22 and the slave latch unit 23 includes three gates DTI for majority decision.

FIG. 7 (a) is a diagram defining a symbol of the gate for majority decision in FIG. 6, FIG. 7(b) is a circuit diagram illustrating a detailed configuration example of FIG. 7(a), and FIG. 7(c) is a truth table illustrating an operation example of FIG. 7(b). As illustrated in FIG. 7(a), the gate DTI for majority decision has two inputs a and b, a pair of complementary gate inputs gt and gb, and one output q. As illustrated in FIG. 7(b), the gate DTI for majority decision includes two PMOS transistors (first conductive transistors) MP11 and MP12 and two NMOS transistors (second conductive transistors) MN11 and MN12.

The two PMOS transistors MP11 and MP12 are connected in series between a power supply voltage (high potential side power supply voltage) VDD and the output q and the two NMOS transistors MN11 and MN12 are connected in series between a ground power supply voltage (low potential side power supply voltage) VSS and the output q. ON and OFF of the two PMOS transistors MP11 and MP12 are controlled by the inputs a and gb, respectively, and ON and OFF of the two NMOS transistors MN11 and MN12 are controlled by the inputs b and gt, respectively. That is, the gate DTI for majority decision has the configuration in which the inputs a and b are separated, different from a normal three-state inverter in which the inputs a and b are the same signals.

In the truth table of FIG. 7(c), 'L' shows a low level, 'H' shows a high level, 'Z' shows high impedance, and 'M' shows a state in which an intermediate voltage is output. If the gate input gb is at a high level and the gate input gt is at a low level, the gate DTI for majority decision outputs the high impedance ('Z'). Meanwhile, in the case in which the gate input gb is at a low level and the gate input gt is at a high level, if the inputs a and b are the same values, the gate DTI for majority decision inverts the inputs and outputs the inputs to the output q and if the inputs a and b are different, the gate DTI for majority decision outputs the high impedance ('Z') or the intermediate voltage ('M'). The intermediate voltage ('M') is an intermediate voltage between the power supply voltage VDD and the ground power supply voltage VSS.

Even in this configuration example, similar to the case of FIG. 1, when the master latch unit 32 and the slave latch unit 33 are in a latch state, the master latch unit 32 and the slave latch unit 33 are operated to arrange nodes NM1b, NM2b, and NM3b or NS1, NS2, and NS3 and the majority decision is executed. For example, as illustrated in a period T1 of FIG. 3, nodes D1b and D2b and the nodes NM1b and NM2b are at a low level, intermediate nodes M1 and M2 are at a high level, nodes D3b and NM3b are at a high level, and an intermediate node M3 is at a low level. In this state, if a level of a clock signal CLK rises to a high level, in the master latch unit 32, the node NM1b is driven at an intermediate voltage, the node NM2b is floated, and the node NM3b is driven at a low level.

Here, a level of the node NM1b driven at the intermediate voltage rises from a low level to the intermediate voltage. However, before reaching the intermediate voltage, the node NM3b is driven at a low level and a level of the intermediate node M3 becomes a high level. Accordingly, the node NM1b is driven at a low level. In addition, the floated node NM2b is driven at a low level when the level of the intermediate node M3 becomes a high level. As a result, all of the nodes NM1b, NM2b, and NM3b are driven at a low level and are stabilized in a state in which the majority decision is executed. The nodes NM1b, NM2b, and NM3b are floated or have the intermediate voltage, until the majority decision is executed in the master latch unit 32. However, the nodes NM1b, NM2b, and NM3b are operated to arrange values with the same values.

Even when the flip-flop according to the third embodiment is used, the same effects as the various effects described in the first embodiment are obtained. In the case of using the configuration example of FIG. 6, because the gate DTI for majority decision also has a function of a transfer gate TG1 for latch, the number of elements can be reduced and an area can be reduced, as compared with the configuration example of FIG. 1. However, because the gate DTI for majority decision in FIG. 6 may output an intermediate voltage, the configuration example of FIG. 1 is preferable from the viewpoint of an operation margin.

In some cases, the gate DTI for majority decision in FIG. 6 can be replaced with a combination of a circuit obtained by removing the PMOS transistor MP12 and the NMOS transistor MN12 from FIG. 7 (b) and the transfer gate TG1 for latch provided in a rear step thereof. In this case, however, a through-current may be generated. For this reason, the configuration example of FIG. 6 is preferably used from the above viewpoint. That is, when each of the master latch unit 22 and the slave latch unit 23 is in a transparent state, the inputs a and b of FIG. 7(b) may become different values. However, because the gate input gb is at a high level and the gate input gt is at a low level, an output becomes the high impedance and the through-current does not flow.

(Fourth Embodiment)

<<Configuration of Main Portion of Semiconductor Device (Modification [3])>>

Figure 8:
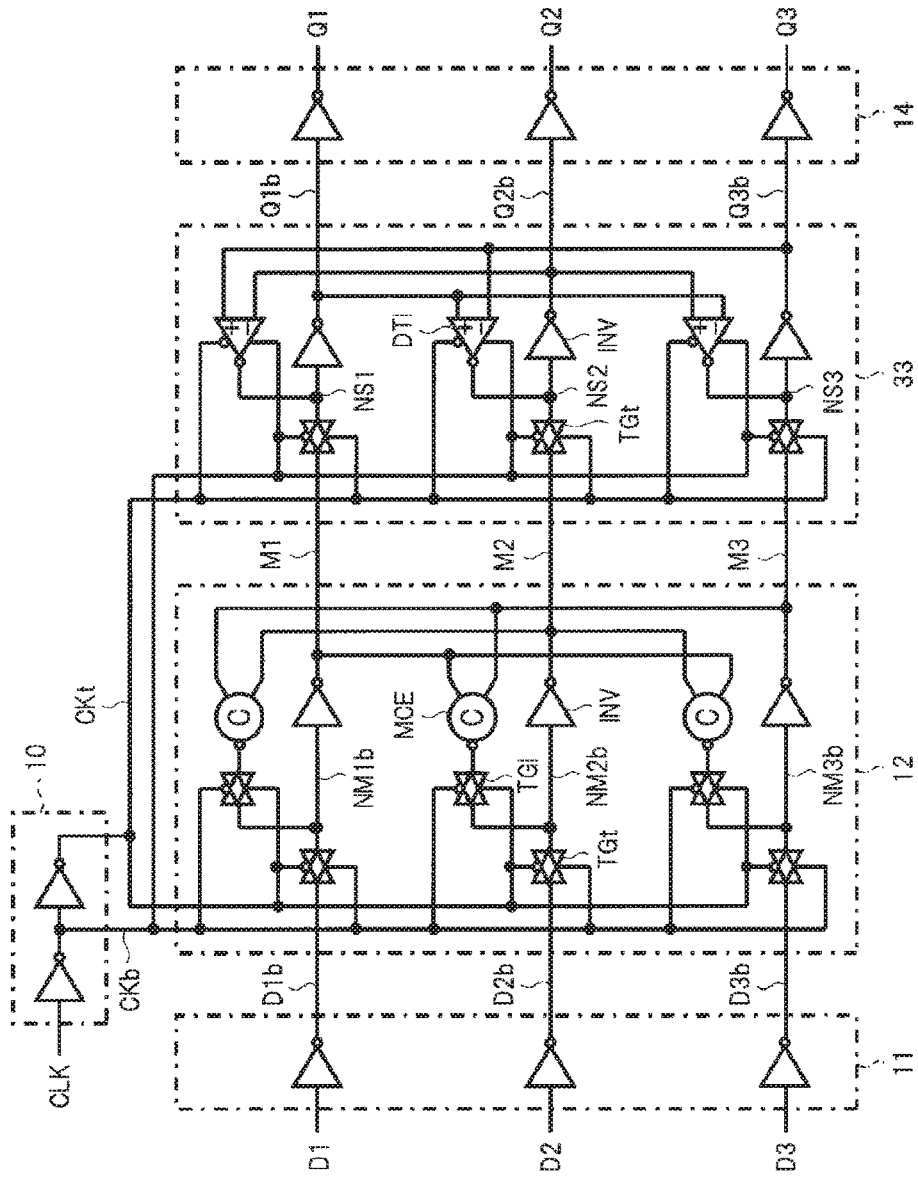
FIG. 8 is a circuit diagram illustrating a configuration example of a flip-flop included in a semiconductor device according to a fourth embodiment of the present invention.

FIG. 8 is a circuit diagram illustrating a configuration example of a flip-flop included in a semiconductor device according to a fourth embodiment of the present invention. The flip-flop illustrated in FIG. 8 includes a clock buffer unit 10, an input buffer unit 11, a master latch unit 12, a slave latch unit 33, and an output buffer unit 14. That is, the flip-flop has a configuration obtained by combining the configuration of the master latch unit 12 of FIG. 1 and the configuration of the slave latch unit 33 of FIG. 6.

As described in the first embodiment, when there is a mismatch in flip-flop input nodes D1, D2, and D3, a level of a clock signal CLK rises and when the master latch unit 12 is in a latch state, a majority decision is executed. A majority decision function of the slave latch unit 33 prevents an erroneous operation from occurring due to a soft error and an influence of a delay time is small. Therefore, the slave latch unit 33 of FIG. 6 in which the number of elements is small as compared with the slave latch unit 13 of FIG. 1 is used. As a result, the same effects as the effects in the case of the first embodiment can be realized with a small area.

In the first to third embodiments, the master latch unit and the slave latch unit have the same circuit configuration. However, as in the fourth embodiment, the master latch units and the slave latch units illustrated in the first to third embodiments may be appropriately combined and the master latch unit and the slave latch unit may have different circuit configurations. In some cases, the majority decision function may be provided in one of the master latch unit and the slave latch unit and the other may have a circuit configuration of a normal D latch such as a master latch unit 72 of FIG. 11 to be described below.

(Fifth Embodiment)

<<Configuration of Main Portion of Semiconductor Device (Modification [4])>>

Figure 9:
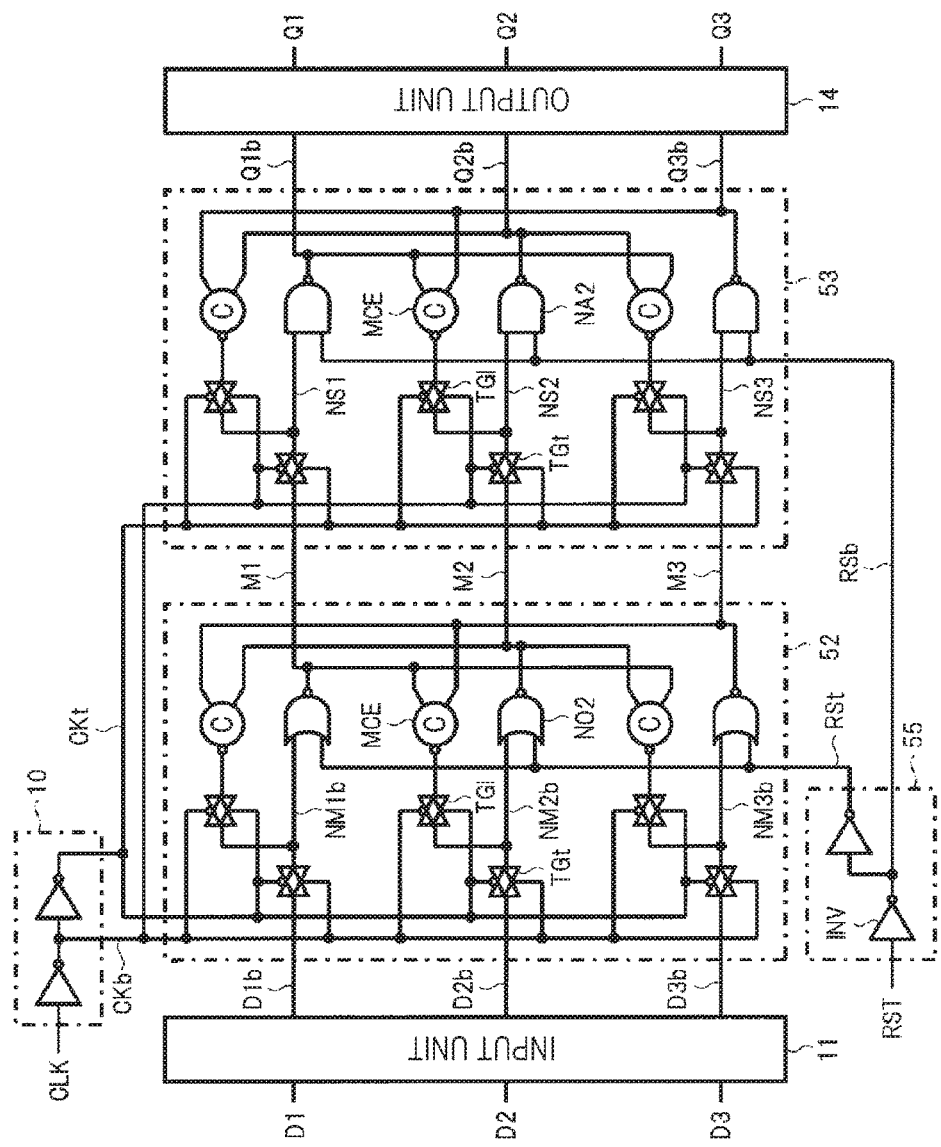
FIG. 9 is a circuit diagram illustrating a configuration example of a flip-flop included in a semiconductor device according to a fifth embodiment of the present invention.

FIG. 9 is a circuit diagram illustrating a configuration example of a flip-flop included in a semiconductor device according to a fifth embodiment of the present invention. The flip-flop illustrated in FIG. 9 is characterized by that an asynchronous reset function is added to the configuration example of FIG. 1.

The flip-flop illustrated in FIG. 9 includes a clock buffer unit 10, an input buffer unit 11, a master latch unit 52, a slave latch unit 53, an output buffer unit 14, and a reset buffer unit 55. Because the clock buffer unit 10, the input buffer unit 11, and the output buffer unit 14 have the same configurations as the configurations in FIG. 1, detailed description thereof is omitted. The reset buffer unit 55 includes two inverters and receives a reset signal RST and supplies complementary internal reset signals RSt and RSb to the master latch unit 52 and the slave latch unit 53.

Similar to the case of FIG. 1, the master latch unit 52 includes three transfer gates TGt for transmission, three transfer gates TG1 for latch, and three C elements MCE. The master latch unit 52 includes three two-input NOR gates NO2, instead of the three inverters INV of FIG. 1. Similar to the case of FIG. 1, the slave latch unit 53 includes three transfer gates TGt for transmission, three transfer gates TG1 for latch, and three C elements MCE. The slave latch unit 53 includes three two-input NAND gates NA2, instead of the three inverters INV of FIG. 1.

In a period in which a reset signal RST is at a high level, levels of intermediate nodes M1, M2, and M3 become a low level by the NOR gate NO2 in the master latch unit 52 and levels of nodes Q1b, Q2b, and Q3b become a high level by the NAND gate NA2 in the slave latch unit 53. Meanwhile, in a period in which the reset signal RST is at a low level, the same operation as the case of the first embodiment is executed. As a result, a D flip-flop with a reset function that has the various effects described in the first embodiment can be realized.

(Sixth Embodiment)
<<Configuration of Main Portion of Semiconductor Device (Modification [5])>>

Figure 10:
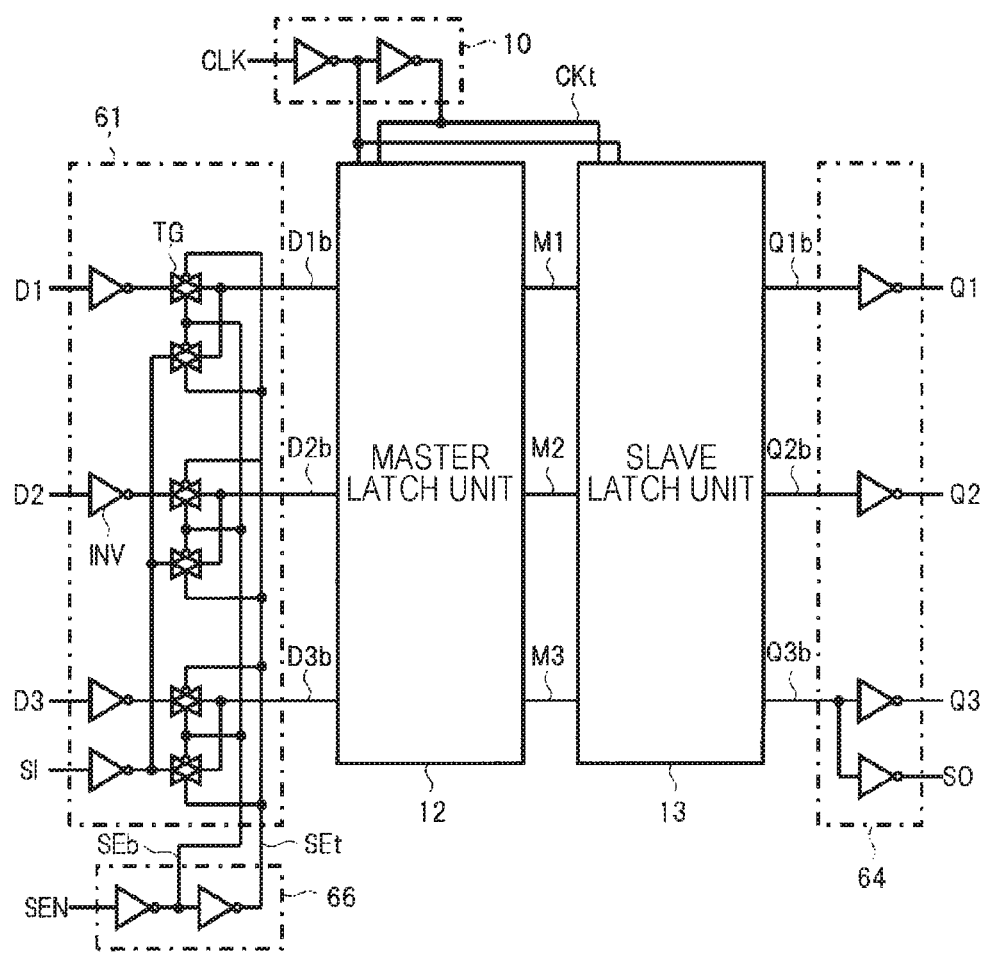
FIG. 10 is a circuit diagram illustrating a configuration example of a flip-flop included in a semiconductor device according to a sixth embodiment of the present invention.

FIG. 10 is a circuit diagram illustrating a configuration example of a flip-flop included in a semiconductor device according to a sixth embodiment of the present invention. The flip-flop illustrated in FIG. 10 is characterized by that a scan function is added to the configuration example of FIG. 1.

The flip-flop illustrated in FIG. 10 includes a clock buffer unit 10, an input buffer unit 61, a master latch unit 12, a slave latch unit 13, an output buffer unit 64, and a scan enable buffer unit 66. Because the clock buffer unit 10, the master latch unit 12, and the slave latch unit 13 have the same configurations as the configurations in FIG. 1, detailed description thereof is omitted. The scan enable buffer unit 66 includes two inverters and receives a scan enable signal SEN and supplies complementary internal scan enable signals SEt and SEb to the input buffer unit 61.

The input buffer unit 61 includes an inverter to which a scan input SI is input, in addition to three inverters INV to which flip-flop input nodes D1, D2, and D3 are input. The input buffer unit 61 selects the flip-flop input nodes D1, D2, and D3 or the scan input SI by six transfer gates TG and outputs selection results to nodes D1b, D2b, and D3b. The selection by the transfer gate TG is controlled by the complementary internal scan enable signals SEt and SEb. The output buffer unit 64 includes an inverter outputting a scan output SO, in addition to three inverters outputting signals to the flip-flop output nodes Q1, Q2, and Q3.

The scan output SO is connected to a scan input of a different flip-flop with a scan function, so that a scan chain can be configured. By setting the scan enable signal SEN to a high level, when a level of a clock signal CLK rises, an operation for transmitting a signal by the scan chain is executed. When the scan enable signal SEN is at a low level, the same operation as the case of the first embodiment is executed.

The flip-flop according to this embodiment includes a circuit corresponding to three D flip-flops. However, because a majority decision function is embedded, the same data is output from the three D flip-flops at all times. Therefore, in the scan chain, the flip-flops are handled as one flip-flop and an overhead of an element number increase by addition of a scan function is decreased.

(Seventh Embodiment)
<<Configuration of Main Portion of Semiconductor Device (Modification [6])>>

Figure 11:
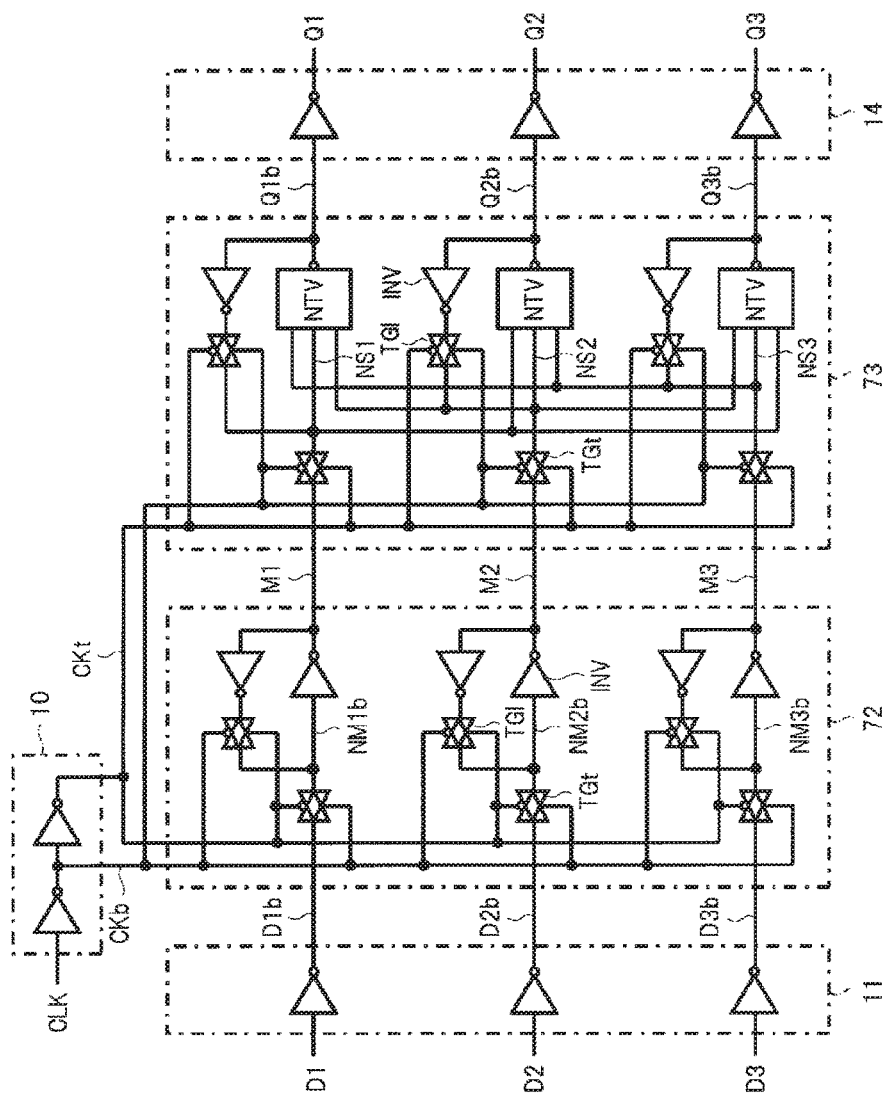
FIG. 11 is a circuit diagram illustrating a configuration example of a flip-flop included in a semiconductor device according to a seventh embodiment of the present invention.

FIG. 11 is a circuit diagram illustrating a configuration example of a flip-flop included in a semiconductor device according to a seventh embodiment of the present invention. The flip-flop illustrated in FIG. 11 is characterized by that a composite gate NTV for majority decision executing the majority decision with an inversion type is provided on a transmission path in a slave latch unit 73.

The flip-flop illustrated in FIG. 11 includes a clock buffer unit 10, an input buffer unit 11, a master latch unit 72, a slave latch unit 73, and an output buffer unit 14. Because the clock buffer unit 10, the input buffer unit 11, and the output buffer unit 14 have the same configurations as the configurations in FIG. 1, detailed description thereof is omitted. The master latch unit 72 includes three transfer gates TGt for transmission, three transfer gates TG1 for latch, and six inverters INV. The master latch unit 72 is configured by three general D latches.

The slave latch unit 73 includes three transfer gates TGt for transmission, three transfer gates TG1 for latch, three inverters INV, and three composite gates NTV for majority decision. In the slave latch unit 73, circuits of three systems using intermediate nodes M1, M2, and M3 as inputs have the same configuration.

For example, in the case of a system using the node M2 as an input, first, when a clock signal CLK is at a low level, the transfer gate TGt for transmission transmits a logic level of the intermediate node M2 to a node NS2. The composite gate NTV for majority decision uses the nodes NS1, NS2, and NS3 as inputs and executes the majority decision of each logic level and outputs a logic level to the node Q2b, in the same way as the case of FIG. 5(c). The inverter INV uses the node Q2b as an input, inverts a logic level thereof, and outputs the logic level to the transfer gate TG1 for latch. When the clock signal CLK is at a low level, the transfer gate TG1 for latch feeds back an output of the inverter INV to the node NS2.

Figure 12:
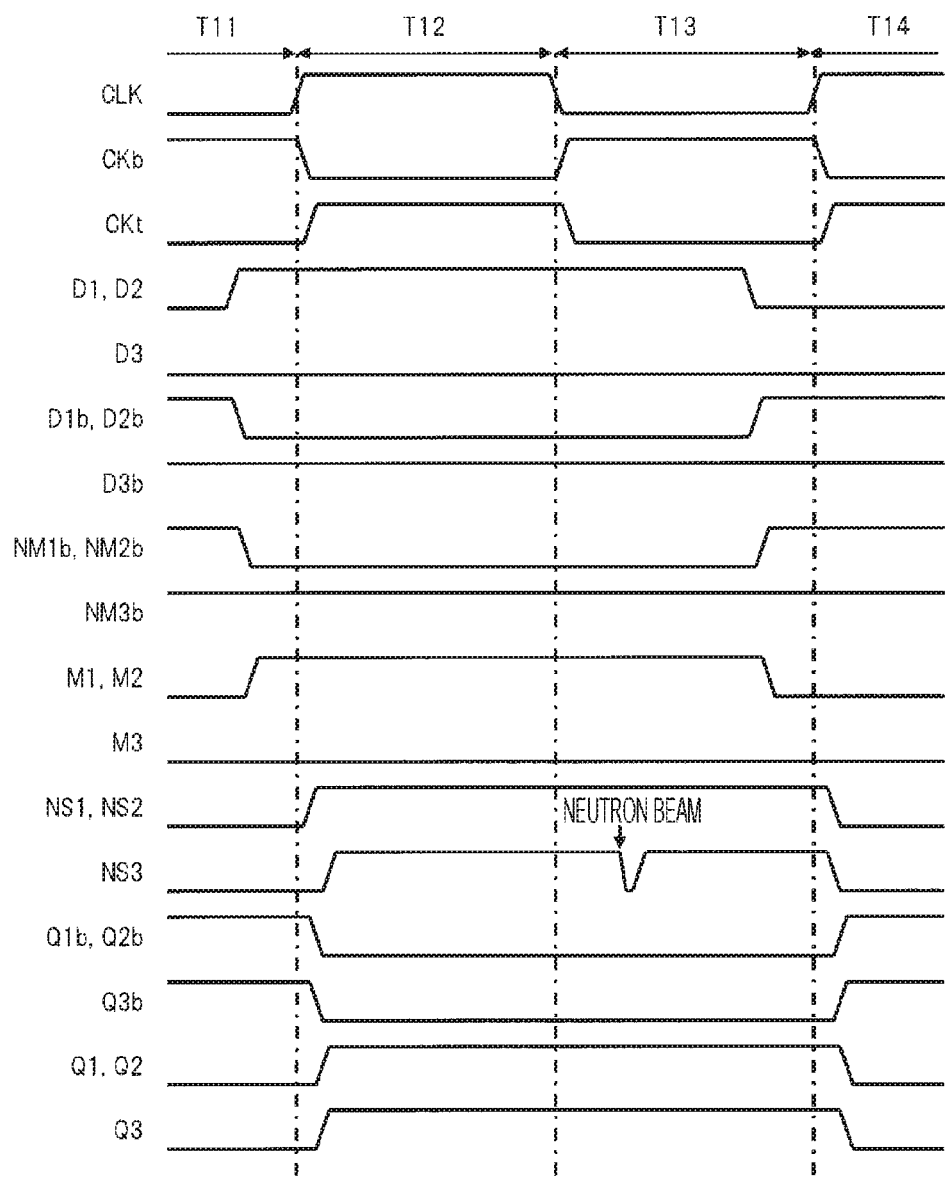
FIG. 12 is a waveform diagram illustrating an operation example of the flip-flop of FIG. 11.

FIG. 12 is a waveform diagram illustrating an operation example of the flip-flop of FIG. 11. In FIG. 12, when the clock signal CLK is at a low level (period T11), the master latch unit 72 is in a transparent state and the slave latch unit 13 is in a latch state. Here, similar to FIG. 3, an example of the case in which levels of D1 and D2 in three flip-flop input nodes D1, D2, and D3 change from a low level to a high level and D3 maintains a low level is described. Levels of the nodes D1b and D2b become a low level, levels of nodes NM1b and NM2b also become a low level through the transfer gate TGt, and levels of the intermediate nodes M1 and M2 become a high level. Meanwhile, a node D3b and a node NM3b maintain a high level and the intermediate node M3 maintains a low level.

If a level of the clock signal CLK rises to a high level (period T12), a state of the master latch unit 72 changes to a latch state and the nodes NM1b, NM2b, and NM3b and the intermediate nodes M1, M2, and M3 maintain logic levels equally. The slave latch unit 73 enters a transparent state. Because the intermediate nodes M1 and M2 are at a high level, levels of the nodes NS1 and NS2 also become a high level. Because the intermediate node M3 is at a low level, the node NS3 maintains a low level.

The three composite gates NTV for majority decision drive the nodes Q1b, Q2b, and Q3b at a low level, according to the truth table illustrated in FIG. 5(c). As a result, levels of the flip-flop output nodes Q1, Q2, and Q3 become a high level. That is, when the level of the clock signal CLK rises, a logic level obtained by executing the majority decision with respect to the logic levels of the three flip-flop input nodes D1, D2, and D3 becomes the logic level obtained by the three flip-flop output nodes Q1, Q2, and Q3. At this time, the node NS3 is driven at a high level by feedback of the inverter INV and is stabilized.

Next, if the level of the clock signal CLK falls to a low level (period T13), the master latch unit 72 enters a transparent state and the slave latch unit 73 enters a latch state. Because the logic levels of the flip-flop input nodes D1, D2, and D3 do not change, logic levels of the individual nodes of the master latch unit 72 and the slave latch unit 73 and the flip-flop output nodes Q1, Q2, and Q3 are maintained in the same state.

Here, the case in which a level of the node NS3 of the slave latch unit 73 in a latch state changes to a low level by a neutron beam is assumed. In this case, the nodes Q1$b$, Q2$b$, and Q3$b$ are maintained at a low level by the composite gate NTV for majority decision and the flip-flop output nodes Q1, Q2, and Q3 are maintained at a high level. In addition, the level of the node NS3 returns to a high level by the feedback by the inverter INV and a soft error by the neutron beam is recovered.

Then, if the levels of the flip-flop input nodes D1 and D2 change from a high level to the same low level as the flip-flop input node D3, levels of the nodes D1$b$ and D2$b$ and the nodes NM1$b$ and NM2$b$ become a high level and levels of the intermediate nodes M1 and M2 become a low level. In this state, if the level of the clock signal CLK rises to a high level (period T14), the master latch unit 72 enters a latch state and the slave latch unit 73 enters a transparent state. As a result, levels of the flip-flop output nodes Q1, Q2, and Q3 become a low level.

Even when the flip-flop according to the seventh embodiment is used, the same effects as the various effects described in the first embodiment are obtained. Here, because the majority decision function is provided on the transmission path of the latch unit, one of the master latch unit and the slave latch unit may be used and the number of elements is suppressed. At this time, because the transmission path is used, the composite gate NTV for majority decision not outputting the high impedance is used, so that a stable operation is realized. Also, it is thought that the majority decision function is provided in the master latch unit. However, because an influence of a soft error of the side of the slave latch unit cannot be reduced, the majority decision function is preferably provided in the slave latch unit, as illustrated in FIG. 11.

In addition, because the operation example illustrated in FIG. 12 corresponds to the case in which the node NS3 is inverted, an influence does not occur in the flip-flop output node Q3. For example, when the node Q3$b$ is inverted, a logic level of the flip-flop output node Q3 is temporarily inverted. However, an original state is recovered by the feedback and SEU does not occur and SET occurs. For example, when a soft error occurs with one node of the master latch unit 72, an influence does not occur in the flip-flop output nodes Q1, Q2, and Q3, by the majority decision function of the side of the slave latch unit 73.

Here, the majority decision function is provided on the transmission path of the slave latch unit. Instead, the C element MCE of FIG. 2($a$), the composite gate NTV for majority decision in FIG. 5($a$), or the gate DTI for majority decision in FIG. 7 ($a$) can be provided on the feedback path of the slave latch unit. When the majority decision function is provided on the transmission path, an influence may occur in an operation speed of the flip-flop. However, when the majority decision function is provided on the feedback path, an influence thereof can be reduced. However, when the majority decision function is provided on the feedback path, an influence may occur temporarily in the flip-flop output nodes Q1, Q2, and Q3, in the case in which the soft error occurs with the nodes NS1, NS2, and NS3 or the master latch unit 72. However, when the majority decision function is provided on the transmission path, an influence thereof can be avoided.

(Eighth Embodiment)

<<Configuration of Semiconductor Device (Application Example [1])>>

Figure 13:
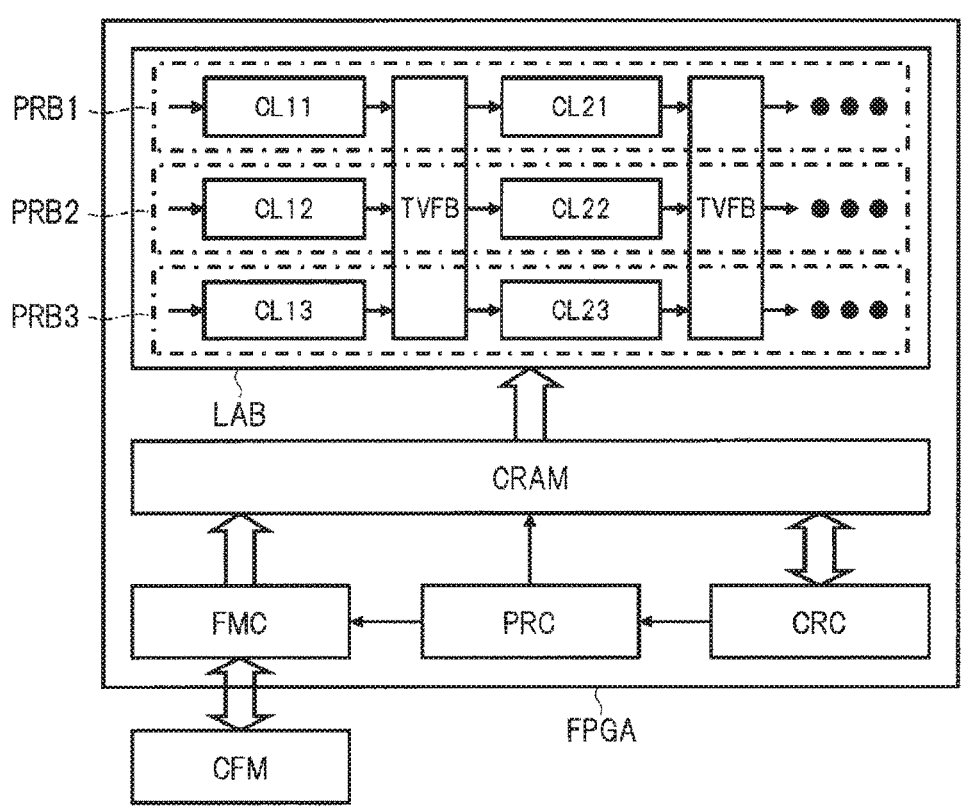
FIG. 13 is a block diagram illustrating a schematic configuration example of a semiconductor device according to an eighth embodiment of the present invention.

FIG. 13 is a block diagram illustrating a schematic configuration example of a semiconductor device according to an eighth embodiment of the present invention. The semiconductor device illustrated in FIG. 13 is a field programmable gate array (FPGA) to which the flip-flop according to the embodiments described above is applied. FIG. 13 schematically illustrates a logical configuration, not a physical arrangement.

The FPGA illustrated in FIG. 13 includes a logic array LAB, configuration memory CRAM, a flash memory controller FMC, a partial reconfiguration controller PRC, and a configuration memory checker CRC. The logic array block LAB includes triplicated combination logic circuits CL11, CL12, and CL13 and CL21, CL22, and CL23 and a flip-flop block TVFB with a majority decision function provided between the triplicated combination logic circuits. A flip-flop according to this embodiment is applied to the flip-flop block TVFB with the majority decision function.

The logic array block LAB is divided into three partial configuration blocks PRB1, PRB2, and PRB3 corresponding to triplicated systems. The configuration memory CRAM is configured on the basis of an SRAM cell and holds configuration data to control a configuration of the logic array block LAB. The flash memory CFM is provided together with the FPGA and stores configuration data. The flash memory controller FMC controls an exchange of the configuration data between the flash memory CFM and the configuration memory CRAM.

The partial reconfiguration controller PRC controls so-called partial reconfiguration for constructing a logical configuration partially for each of the three partial reconfiguration blocks PRB1, PRB2, and PRB3. The configuration memory checker CRC checks the data held in the configuration memory CRAM by a method such as a cyclic redundancy code.

Figure 14:
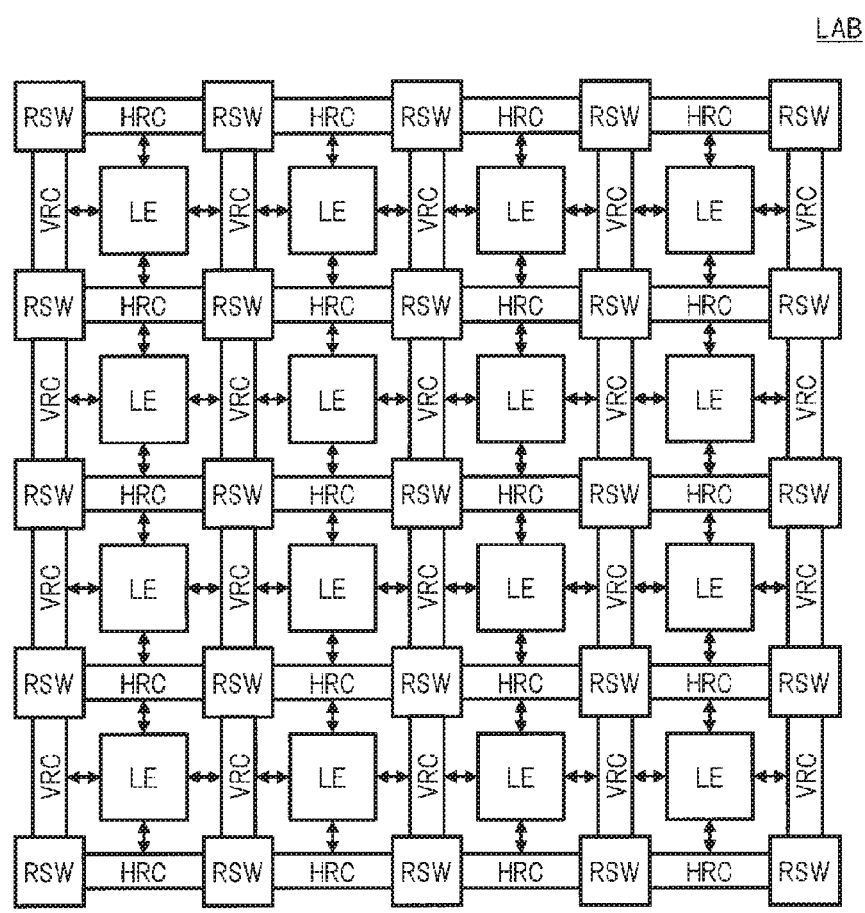
FIG. 14 is a block diagram schematically illustrating a main portion of a logic array in FIG. 13.

FIG. 14 is a block diagram schematically illustrating a main portion of the logic array in FIG. 13. In the logic array LAB of FIG. 14, logic elements LE are arranged in an array shape. Longitudinal direction wiring channels VRC are arranged in a mesh shape on the left and right of the logic elements LE and transverse direction wiring channels HRC are provided in a mesh shape on and below the logic elements LE. The longitudinal direction wiring channel VRC and the transverse direction wiring channel HRC execute signal transmission between the logic elements LE. Wiring switches RSW are provided at intersections of the longitudinal direction wiring channels VRC and the transverse direction wiring channels HRC. Configurations of the logic element LE and the wiring switch RSW are determined by the configuration data.

Figure 15:
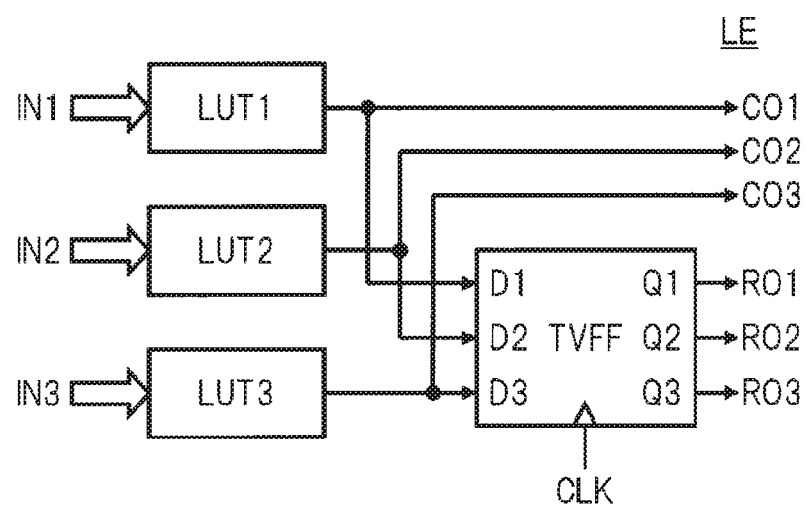
FIG. 15 is a block diagram illustrating a configuration example of a main portion of a logic element in FIG. 14.

FIG. 15 is a block diagram illustrating a configuration example of a main portion of the logic element in FIG. 14. The logic element LE illustrated in FIG. 15 includes three lookup tables LUT1, LUT2, and LUT3 corresponding to triplicated systems and a flip-flop TVFF with a majority decision function. The flip-flop according to the embodiments is applied to the flip-flop TVFF with the majority decision function. The logic element LE has output nodes C01, C02, and C03 output directly from the lookup tables LUT1, LUT2, and LUT3 and output nodes R01, R02, and R03 passing through the flip-flop TVFF with the majority decision function. In this drawing, only a set of triplication logic circuits are illustrated. However, a plurality of sets can be provided in one logic element LE and this is appropriately determined to raise efficiency of an arrangement.

In the FPGA, because switching control of reference data of the lookup table or the wiring switch is executed by the configuration data, a logic configuration may be changed due to a soft error in the configuration memory. For this reason, it is effective to realize triplication to increase reliability. At this time, because the flip-flop according to this embodiment can reduce a penalty associated with the triplication as described above, this is preferable.

The flip-flop according to this embodiment corrects an error automatically by the majority decision. For this reason, an operation for comparing outputs of the individual flip-flops and detecting an error occurring in the lookup table is not executed. Therefore, the error is detected by the configuration memory checker CRC. If the configuration memory checker CRC detects the error, the configuration memory checker CRC executes the partial configuration of the partial reconfiguration block affected by the error, by the partial reconfiguration controller PRC.

When the triplication logic circuit is recovered by the partial reconfiguration, generally, data needs to be copied from the flip-flop of the normally operating partial reconfiguration block to the flip-flop of the partial reconfiguration block executing the partial reconfiguration, such that data held by the flip-flops are matched. The flip-flops according to this embodiment are used, so that the data of the flip-flops are matched at all times in the triplication logic circuit, as described in the first embodiment, and an operation for copying the data of the flip-flops is not necessary. For this reason, control is easy and recovery in the partial reconfiguration can be completed in short time.

(Ninth Embodiment)
<<Configuration of Main Portion of Semiconductor Device (Application Example [2])>>

Here, the case in which a flip-flop according to this embodiment is used as one high reliable flip-flop will be described.

Figure 16:
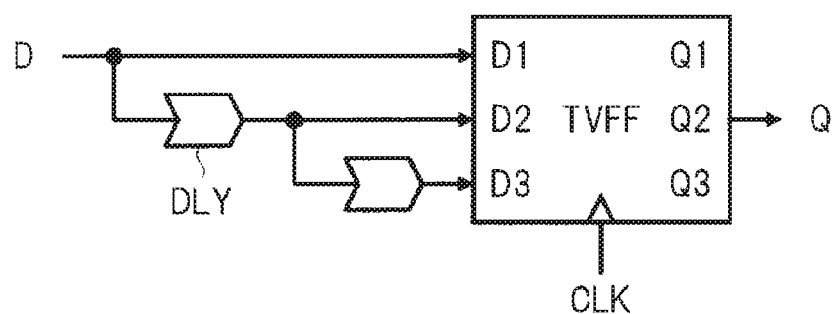
FIG. 16 is a block diagram illustrating a schematic configuration example of a flip-flop included in a semiconductor device according to a ninth embodiment of the present invention.

FIG. 16 is a block diagram illustrating a schematic configuration example of a flip-flop included in a semiconductor device according to a ninth embodiment of the present invention. The high reliable flip-flop illustrated in FIG. 16 includes two delay circuits DLY and a flip-flop TVFF with a majority decision function. The flip-flop according to the embodiment described above is applied to the flip-flop TVFF with the majority decision function.

A signal of an input node D is input to a flip-flop input node D1 of the flip-flop TVFF with the majority decision function. A signal obtained by delaying the signal of the input node D by one delay circuit DLY and a signal obtained by delaying the signal by the two delay circuits DLY are input to the flip-flop input nodes D1 and D2 of the flip-flop TVFF with the majority decision function. As an output node Q of the flip-flop TVFF with the majority decision function, one (for example, Q2) of three flip-flop output nodes Q1, Q2, and Q3 is used.

A signal obtained by delaying the signal of the input node D by a delay time of the delay circuit DLY is input to the flip-flop input nodes D1, D2, and D3. As a result, even when a soft error is transmitted as SET to the input node D, the soft error can be recovered by the majority decision, because the flip-flop TVFF with the majority decision function receives a signal change according to the soft error at different timing in the flip-flop input nodes D1, D2, and D3. As a result, a high reliable D flip-flop can be realized.

The configuration example of FIG. 16 can be realized by the small number of elements as compared with the case in which reliability is ensured by three flip-flops and a majority decision circuit, similar to the case of FIG. 21. Therefore, high reliability can be ensured with small area and consumption power.

(Tenth Embodiment)
<<Configuration of Main Portion of Semiconductor Device (Application Example [3])>>

Figure 17:
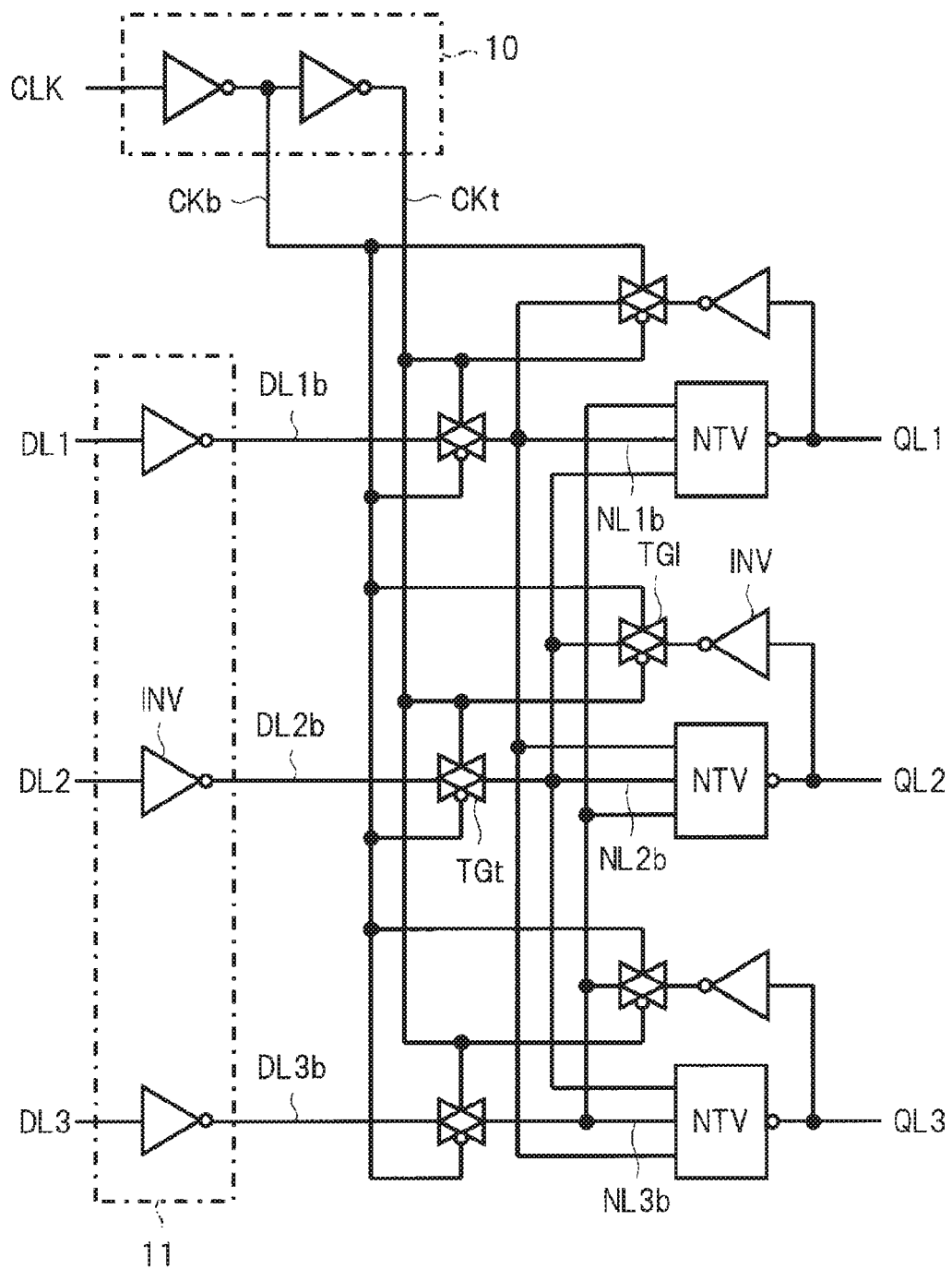
FIG. 17 is a circuit diagram illustrating a configuration example of a latch circuit included in a semiconductor device according to a tenth embodiment of the present invention.

In the previous embodiments, the flip-flop is described as the example. However, the present invention is not limited thereto. For example, a concept that expresses embedding a majority decision function in a circuit holding information can be applied to a latch circuit. FIG. 17 is a circuit diagram illustrating a configuration example of a latch circuit included in a semiconductor device according to a tenth embodiment of the present invention. The latch circuit illustrated in FIG. 17 includes a clock buffer unit 10, an input buffer unit 11, three transfer gates TGt for transmission, three transfer gates TG1 for latch, three inverters INV, and three composite gates NTV for majority decision. The clock buffer unit 10 and the input buffer unit 11 have the same configurations as FIG. 1 and the remaining circuit has the same configuration as the slave latch unit 73 in FIG. 11.

In a period in which a clock signal CLK is at a high level, the latch circuit is in a transparent state, logic levels of nodes DL1b, DL2b, and DL3b are taken in nodes NL1b, NL2b, and NL3b via the transfer gates TGt for transmission, a majority decision is executed by the composite gates NTV for majority decision, and the logic levels are output to output nodes QL1, QL2, and QL3. In a period in which the clock signal CLK is at a low level, the latch circuit is in a latch state and the logic levels of the output nodes QL1, QL2, and QL3 are fed back to the nodes NL1b, NL2b, and NL3b via the inverters INV and the transfer gates TG1 for latch.

In this embodiment, the composite gate NTV for majority decision is used at the side of the driver in the transparent state. As a reason, first, an operation result of logic of a front step is transmitted to a rear step in the period in which the clock signal CLK is at a high level, a level of the clock signal CLK becomes a low level, and the latch circuit holds data. Here, a circuit configuration becomes a circuit configuration that can show a correct logic signal as an expectation value until a level of a next clock signal becomes a high level from the moment at which the level of the clock signal becomes a high level, as the signal transmitted to the rear step, when the composite gate NTV for majority decision is used at the side of the driver in the transparent state. That is, it is preferable to use the configuration according to this embodiment to enable the majority decision when the clock signal is at a high level and when the clock signal is at a low level.

By using the latch circuit according to the tenth embodiment, the same effects as the effects described in the individual embodiments can be obtained.

<<Outline of Main Characteristic of Each Embodiment>>

Figure 18:
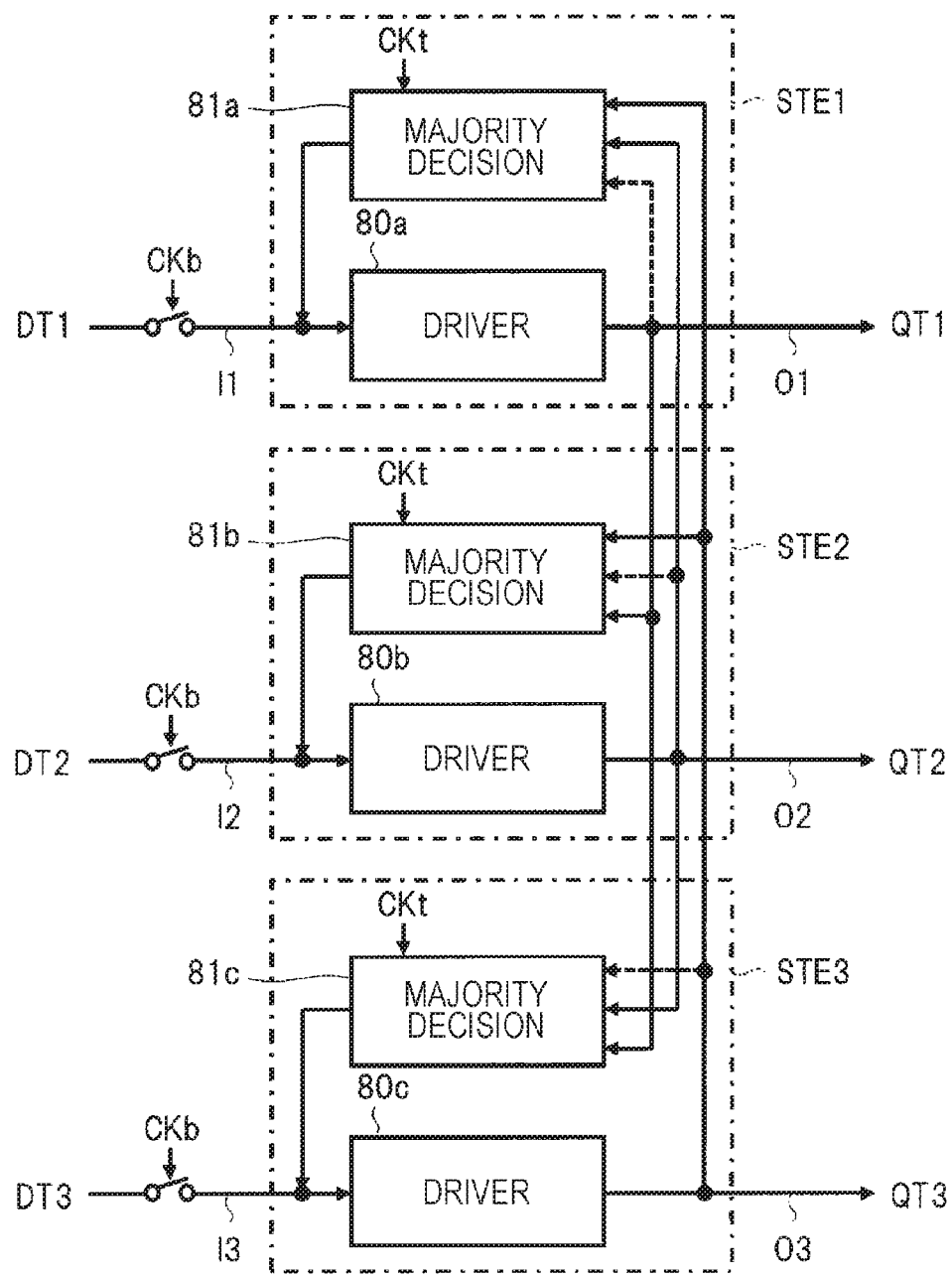
FIG. 18 is a block diagram illustrating a schematic configuration example of a main portion of a semiconductor device according to an embodiment of the present invention.
Figure 19:
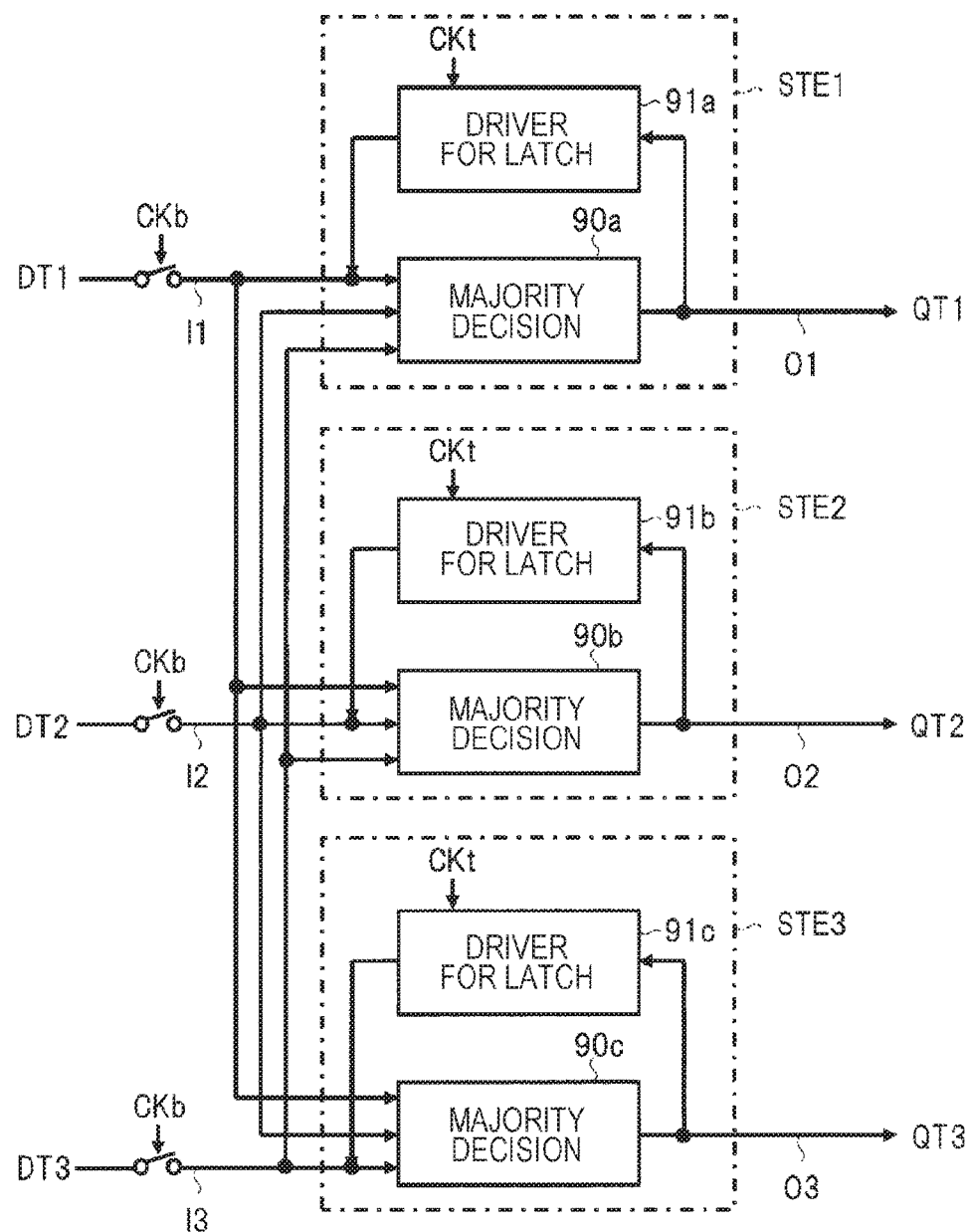
FIG. 19 is a block diagram illustrating a schematic configuration example different from FIG. 18.

FIG. 18 is a block diagram illustrating a schematic configuration example of a main portion of a semiconductor device according to an embodiment of the present invention and FIG. 19 is a block diagram illustrating a schematic configuration example different from FIG. 18. As illustrated in FIGS. 18 and 19, the semiconductor device according to this embodiment has a latch circuit that includes first to third storage elements STE1 to STE3. That is, the latch circuit has input/output paths of three systems independent from each other and includes the first to third storage elements STE1 to STE3 provided on the input/output paths of the three systems. Each of the first to third storage elements STE1 to STE3 holds input data in synchronization with a clock signal.

The first storage element STE1 is provided between a first storage input node I1 and a first storage output node O1, the second storage element STE2 is provided between a second storage input node I2 and a second storage output node O2, and the third storage element STE3 is provided between a third storage input node I3 and a third storage output node O3.

In a period in which the clock signal is at a one logic level (here, a second logic level at which a level of an inversion clock signal CLKb becomes a high level) of first and second logic levels, input data DT1 to DT3 are taken in the N-th storage input nodes I1 to I3. In addition, output data QT1 to QT3 are output from the N-th storage output nodes I1 to I3, respectively.

Here, a main characteristic is that each of the first to third storage elements STE1 to STE3 has a majority decision unit provided on any one of a transmission path using the storage input node as an input and a feedback path using the storage input node as an output and data in which a result of the majority decision is reflected is output. Here, the majority decision unit executes the majority decision using data from the storage elements provided on other input/output paths different from an input/output path thereof. As a result, as described in the individual embodiments, representatively, a penalty (area/consumption power/delay time) associated with ensuring reliability can be reduced and a recovery process when an error occurs in configuring a state machine can be facilitated.

In the configuration example of FIG. 18, the majority decision unit is provided on the feedback path. In FIG. 18, the N-th (N=1, 2, and 3) storage elements STE1 to STE3 include N-th driver units 80a to 80c and N-th majority decision units 81a to 81c, respectively. The N-th driver units 80a to 80c are configured using inverters and drive signals of the N-th storage input nodes I1 to I3 and output the signals to the N-th storage output nodes O1 to o3, respectively. The N-th majority decision units 81a to 81c reflect majority decision results in the N-th storage input nodes I1 to I3, in a period in which the clock signal is one logic level (here, the first logic level in which a level of the clock signal CLKt becomes a high level) of the first and second logic levels.

The N-th majority decision units 81a to 81c include the configurations of FIGS. 2(a) and 5(a) or FIG. 7(a). When the N-th majority decision units 81a to 81c include the configurations of FIGS. 2(a) and 5(a), the N-th majority decision units 81a to 81c also include transfer gates. When the N-th majority decision units 81a to 81c include the configurations of FIGS. 2(a) and 7(a), the N-th majority decision unit (for example, 81a) uses the storage output nodes (O2 and O3) of the other two storage elements as inputs and sets a logic level of the N-th storage input node (I1) according to a logic level when the logic levels of the two storage output nodes are matched/mismatched. Meanwhile, when the N-th majority decision units 81a to 81c include the configuration of FIG. 5(a), the N-th majority decision unit (for example, 81a) uses the first to third storage output nodes O1 to O3 as inputs and outputs a logic level corresponding to a majority decision result of logic levels of the three storage output nodes to the N-th storage input node (I1).

Here, the storage element is provided on each of the input/output paths of the three systems. However, the present invention is not limited to the three systems and may include three systems or more in some cases. That is, systems of the number in which the majority decision is enabled, such as five systems, may be included. However, the three systems are preferable from the viewpoint of a circuit area. Here, the majority decision units are provided in all of the three systems. However, the present invention is not limited thereto and the majority decision unit may be provided in at least one system. For example, in some cases, the majority decision unit of FIG. 5(a) can be provided on a feedback path of a certain system and data output from the corresponding system can be handled as correct data. However, the majority decision units are preferably provided in all of the three systems to raise reliability.

In the configuration example of FIG. 19, the majority decision unit is provided on a transmission path. In FIG. 19, the N-th (N=1, 2, and 3) storage elements STE1 to STE3 include N-th driver units 91a to 91c for latch and N-th majority decision units 90a to 90c, respectively. The N-th driver units 91a to 91c for latch are configured using inverters and transfer gates and positively feed back data of the N-th output nodes O1 to O3 to the N-th input nodes I1 to I3, respectively, in a period in which the clock signal is one logic level (here, the first logic level in which a level of the clock signal CLKt becomes a high level) of the first and second logic levels.

The N-th majority decision units 90a to 90c include the configuration of FIG. 5(a). In this case, the N-th majority decision unit (for example, 90a) uses the first to third input nodes I1 to I3 as inputs and outputs a logic level corresponding to a majority decision result of the three input nodes to the N-th output node (O1).

Figure 20:
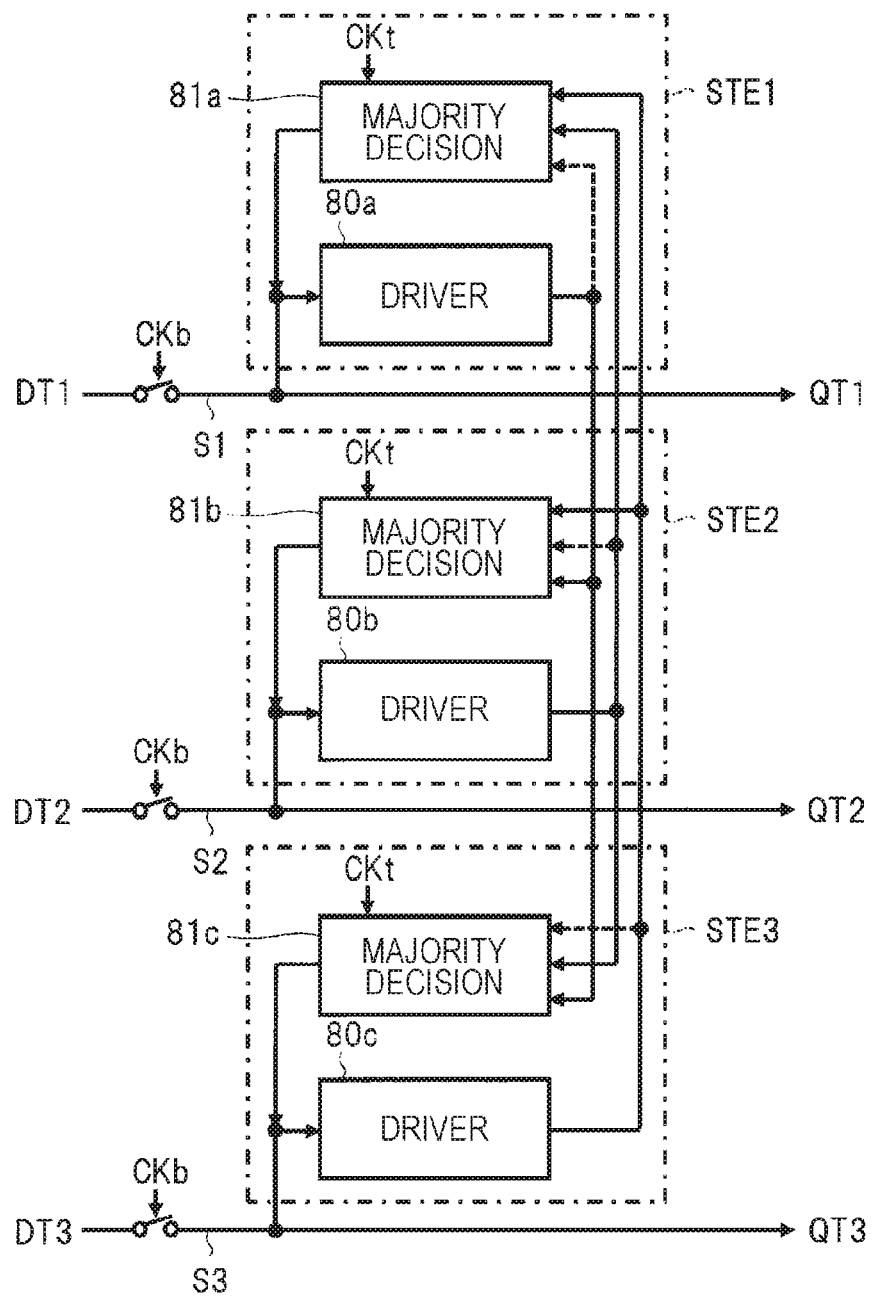
FIG. 20 is a block diagram illustrating a schematic configuration example of a modification of FIG. 18.

FIG. 20 is a block diagram illustrating a schematic configuration example of a modification of FIG. 18. The storage element illustrated in FIGS. 18 and 19 includes a drive function between an input and an output for driving data input to the storage input node and outputting the data to the storage output node. However, the storage element may be used for retention of data, not for the above use.

In a semiconductor device (latch circuit) illustrated in FIG. 20, the storage input node I1 and the storage output node O1 in the configuration example of FIG. 18 become a common storage node S1. Likewise, in FIG. 20, the storage input nodes I2 and I3 and the storage output nodes O2 and O3 in FIG. 18 become common storage nodes S2 and S3, respectively. In addition, the individual storage elements STE1 to STE3 in FIG. 20 function as balloons to keep data of the corresponding storage nodes S1 to S3 and modify the data on the basis of the majority decision, without executing the drive between input and output nodes.

That is, the semiconductor device illustrated in FIG. 20 obtains the output data QT1 to QT3 in FIG. 18 from the inputs of the N-th driver units 80a to 80c, not the outputs of the N-th driver units 80a to 80c. The other configuration is the same as the configuration of the case of FIG. 18. Similar to the case of FIG. 18, the majority decision units 81a to 81c in the individual storage elements STE1 to STE3 use the outputs of the corresponding driver units as the inputs, execute the majority decision, and reflect the majority decision results in the inputs of the driver units. As a result, in each storage node, the retention of the data and the modification of the data based on the majority decision are enabled. Here, the configuration example of the modification of FIG. 18 is illustrated. However, FIG. 19 can be modified in the same way.

The invention accomplished by the present inventors has been described specifically on the basis of the embodiments. However, the present invention is not limited to the embodiments described above and various changes can be made without departing from the scope of the invention. For example, the embodiments are described in detail to facilitate the description of the present invention and the present invention is not limited to embodiments in which all of the described configurations are included. In addition, a part of the configurations of the certain embodiment can be replaced by the configurations of another embodiment or the configurations of another embodiment can be added to the configurations of the certain embodiment. In addition, for a part of the configurations of the individual embodiments, addition, removal, and replacement of other configurations can be performed.

REFERENCE SIGNS LIST 10 clock buffer unit
11, 61 input buffer unit
12, 22, 32, 52, 72 master latch unit
13, 23, 33, 53, 73 slave latch unit
14, 64 output buffer unit
55 reset buffer unit
66 scan enable buffer unit
80a to 80c driver unit
81a to 81c, 90a to 90c majority decision unit
91a to 91c driver unit for latch
C01 to C03, Q, QL1 to QL3, R01 to R03 output node
CFM flash memory
CKb, CKt internal clock signal
CL11 to CL13, CL21 to CL23 combination logic circuit
CLK, CLKt clock signal
CLKb inversion clock signal
CRAM configuration memory
CRC configuration memory checker
D input node
D1 to D3 flip-flop input node
D1b to D3b, DL1b to1 DL3b, NL1b to NL3b, NM1b to NM3b, NS1 to NS3, Q1b to Q3b node
DLY delay circuit
DT1 to DT3 input data
DTI gate for majority decision
FF flip-flop
FMC flash memory controller
HRC transverse direction wiring channel
I1 to I3 storage input node
INV inverter
LAB logic array
LE logic element
STE1 to STE3 storage element
LUT1 to LUT3 lookup table
M1 to M3 intermediate node
MCE C element
MN1, MN2, MN5 to MN9, MN11, MN12 NMOS transistor
MP1, MP2, MP5 to MP9, MP11, MP12 PMOS transistor
NA2 two-input NAND gate
NA3 three-input NAND gate
NO2 two-input NOR gate
NTV composite gate for majority decision
O1 to O3 storage output node
PRB1 to PRB3 partial reconfiguration block
PRC partial reconfiguration controller
Q1 to Q3 flip-flop output node
QT1 to QT3 output data
RST reset signal
RSW wiring switch
RSt, RSb internal reset signal
S1 to S3 storage node
SEN scan enable signal
SEt, SEb internal scan enable signal
SI scan input
SO scan output
TG1 transfer gate for latch
TGt transfer gate for transmission
TRV majority decision circuit
TVFB flip-flop block with majority decision function
TVFF flip-flop with majority decision function
VDD power supply voltage
VRC longitudinal direction wiring channel
VSS ground power supply voltage

The invention claimed is:

1. A semiconductor device, comprising:
a latch circuit which has input/output nodes for connecting three or more redundant systems, each of which outputs/inputs same data as each other and is mutually independent from each other,
wherein the latch circuit includes a plurality of storage elements, each of which is connected to corresponding input/output nodes in the latch circuit, respectively, and holds each input data in synchronization with a clock signal, and
at least one storage element of the plurality of storage elements includes a majority decision unit configured to determine an input held by a majority of the storage elements based on a comparison of data from the storage elements provided on other input/output nodes different from the input/output nodes of the at least one storage element and to output decision data indicating the input held by the majority of the storage elements.

2. The semiconductor device according to claim 1,
wherein the plurality of storage elements includes a first storage element which is provided between a first storage input node and a first storage output node, a second storage element which is provided between a second storage input node and a second storage output node, and a third storage element which is provided between a third storage input node and a third storage output node,
an N-th (N =1, 2, and 3) storage element has an N-th driver unit which drives a signal of an N-th storage input node and outputs the signal to an N-th storage output node, and an N-th majority decision unit which reflects a majority decision result in the N-th storage input node, in a period in which the clock signal is at one logic level of first and second logic levels, and
the N-th majority decision unit uses the storage output nodes of two other storage elements as inputs and sets a logic level of the N-th storage input node according to a logic level when logic levels of the two storage output nodes are matched/mismatched.

3. The semiconductor device according to claim 2,
wherein, when the logic levels of the two storage output nodes are matched, the N-th majority decision unit outputs a logic level corresponding to the logic levels to the N-th storage input node and when the logic levels of the two storage output nodes are mismatched, the N-th majority decision unit outputs high impedance to the N-th storage input node.

4. The semiconductor device according to claim 3,
wherein the N-th majority decision unit has two first conductive transistors which are connected in series between a high potential side power supply voltage and an output, and two second conductive transistors which are connected in series between a low potential side power supply voltage and the output, ON/OFF of the two first conductive transistors are controlled by the two storage output nodes, and ON/OFF of the two second conductive transistors are controlled by the two storage output nodes.

5. The semiconductor device according to claim 2,
wherein the N-th majority decision unit has two first conductive transistors which are connected in series between a high potential side power supply voltage and an output, and two second conductive transistors which are connected in series between a low potential side power supply voltage and the output, ON/OFF of one of the two first conductive transistors are controlled by one of the two storage output nodes, ON/OFF of one of the two second conductive transistors are controlled by the other of the two storage output nodes, and ON/OFF of the other of the two first conductive transistors and the other of the two second conductive transistors is controlled by the clock signal.

6. The semiconductor device according to claim 2, further comprising:
a fourth storage element which is provided in a front step of the first storage element;
a fifth storage element which is provided in a front step of the second storage element; and
a sixth storage element which is provided in a front step of the third storage element,
wherein the fourth to sixth storage elements are provided at a master side of a master/slave-type flip-flop, and
the first to third storage elements are provided at a slave side of the master/slave-type flip-flop.

7. The semiconductor device according to claim 2, further comprising:
a first combination logic circuit which is provided in a front step of the first storage input node;
a second combination logic circuit which is provided in a front step of the second storage input node; and
a third combination logic circuit which is provided in a front step of the third storage input node,
wherein the first to third combination logic circuits include a lookup table and execute the same logical operation.

8. The semiconductor device according to claim 7, further comprising:
a memory which holds configuration data of the lookup table;
a memory checker which detects an error of the memory; and
a controller which partially rewrites the configuration data of the memory.

9. The semiconductor device according to claim 1,
wherein the latch circuit includes a first storage element which is provided between a first storage input node and a first storage output node, a second storage element which is provided between a second storage input node and a second storage output node, and a third storage element which is provided between a third storage input node and a third storage output node,
the N-th (N =1, 2, and 3) storage element has an N-th driver unit which drives a signal of the N-th storage input node and outputs the signal to the N-th storage output node, and an N-th majority decision unit which reflects a majority decision result in the N-th storage input node, in a period in which the clock signal is at one logic level of first and second logic levels, and
the N-th majority decision unit uses the first to third storage output nodes as inputs and outputs a logic level corresponding to a majority decision result of logic levels of the three storage output nodes to the N-th storage input node.

10. The semiconductor device according to claim 9, further comprising:
a fourth storage element which is provided in a front step of the first storage element;
a fifth storage element which is provided in a front step of the second storage element; and
a sixth storage element which is provided in a front step of the third storage element,
wherein the fourth to sixth storage elements are provided at a master side of a master/slave-type flip-flop, and
the first to third storage elements are provided at a slave side of the master/slave-type flip-flop.

11. The semiconductor device according to claim 9, further comprising:
a first combination logic circuit which is provided in a front step of the first storage input node;
a second combination logic circuit which is provided in a front step of the second storage input node; and
a third combination logic circuit which is provided in a front step of the third storage input node,
wherein the first to third combination logic circuits include a lookup table and execute the same logical operation.

12. The semiconductor device according to claim 1,
wherein the latch circuit includes a first storage element which is provided between a first input node and a first output node, a second storage element which is provided between a second input node and a second output node, and a third storage element which is provided between a third input node and a third output node, and
the N-th (N =1, 2, and 3) storage element has an N-th driver unit for latch which positively feeds back data of the N-th output node to the N-th input node, in a period in which the clock signal is at one logic level of first and second logic levels, and an N-th majority decision unit which uses the first to third input nodes as inputs and outputs a logic level corresponding to a majority decision result of the three input nodes to the N-th output node.

13. The semiconductor device according to claim 12, further comprising:
a fourth storage element which is provided in a front step of the first storage element;
a fifth storage element which is provided in a front step of the second storage element; and
a sixth storage element which is provided in a front step of the third storage element,
wherein the fourth to sixth storage elements are provided at a master side of a master/slave-type flip-flop, and
the first to third storage elements are provided at a slave side of the master/slave-type flip-flop.

14. The semiconductor device according to claim 12, further comprising:
a first combination logic circuit which is provided in a front step of the first storage input node;
a second combination logic circuit which is provided in a front step of the second storage input node; and
a third combination logic circuit which is provided in a front step of the third storage input node,
wherein the first to third combination logic circuits include a lookup table and execute the same logical operation.

* * * * *